(12) United States Patent
Heller et al.

(10) Patent No.: US 10,754,250 B2
(45) Date of Patent: Aug. 25, 2020

(54) DNA DOUBLE-WRITE/DOUBLE BINDING IDENTITY

(71) Applicant: The Regents of the University of California, Oakland, CA (US)

(72) Inventors: Michael J. Heller, Poway, CA (US); Elaine Skowronski, Encinitas, CA (US); Youngjun Song, San Diego, CA (US); John Warner, Del Mar, CA (US); Shaochen Chen, San Diego, CA (US)

(73) Assignee: The Regents of the University of California, Oakland, CA (US)

( * ) Notice: Subject to any disclaimer, the term of this patent is extended or adjusted under 35 U.S.C. 154(b) by 73 days.

(21) Appl. No.: 14/908,836

(22) PCT Filed: Jul. 31, 2014

(86) PCT No.: PCT/US2014/049227
§ 371 (c)(1),
(2) Date: Jan. 29, 2016

(87) PCT Pub. No.: WO2015/017694
PCT Pub. Date: Feb. 5, 2015

(65) Prior Publication Data
US 2016/0179008 A1 Jun. 23, 2016

Related U.S. Application Data

(60) Provisional application No. 61/860,508, filed on Jul. 31, 2013.

(51) Int. Cl.
| | | |
|---|---|---|
| G03F 7/26 | (2006.01) | |
| G03F 7/00 | (2006.01) | |
| G03F 7/16 | (2006.01) | |
| G03F 7/20 | (2006.01) | |
| B82Y 40/00 | (2011.01) | |

(52) U.S. Cl.
CPC .............. *G03F 7/26* (2013.01); *G03F 7/0002* (2013.01); *G03F 7/16* (2013.01); *G03F 7/2002* (2013.01); *B01J 2219/00637* (2013.01); *B01J 2219/00711* (2013.01); *B01J 2219/00722* (2013.01); *B82Y 40/00* (2013.01)

(58) Field of Classification Search
CPC .................................. G01F 7/26; B82Y 40/00
See application file for complete search history.

(56) References Cited

U.S. PATENT DOCUMENTS

| | | | |
|---|---|---|---|
| 5,514,785 | A | 5/1996 | Van Ness et al. |
| 6,652,808 | B1 | 11/2003 | Heller et al. |
| 2003/0078314 | A1 | 4/2003 | Johnson et al. |
| 2003/0124525 | A1 | 7/2003 | Elghanian et al. |
| 2004/0115696 | A1 | 6/2004 | Heller |
| 2009/0239157 | A1 | 9/2009 | Ryu |
| 2010/0056720 | A1* | 3/2010 | Kwon ................... C08F 297/04 525/54.1 |
| 2010/0292094 | A1* | 11/2010 | Lapointe .............. C12Q 1/6886 506/9 |
| 2013/0115718 | A1* | 5/2013 | Hirota ...................... G07D 7/14 436/501 |

FOREIGN PATENT DOCUMENTS

| | | | |
|---|---|---|---|
| JP | WO 2012/008581 | * | 1/2012 |
| WO | WO 1987/01134 | | 2/1987 |

OTHER PUBLICATIONS

Song et al , A Programmable DNA Double-Write Material: Synergy of Photolithography and Self-Assembly Nanofabrication, 2017, ACS Appl. Mater. Interfaces, 9, 22-28. -Post art (Year: 2017).*
Guo et al, Direct fluorescence analysis of genetic polymorphisms by hybridization with oligonucleotide arrays on glass supports, 1994, Nucleic Acids Research, 22, 5456-5465. (Year: 1994).*
1,4-phenylene diisothiocyanate (PDC) brochure, Sigma-Aldrich, printed form the vendor web site on Jan. 7, 2020, p. 1 (Year: 2020).*
"Small Wonders: Endless Frontiers," Publication from the National Research Council on the review of the National Nanotechnology Initiative, 2002, 14 pages [Table of Contents Only].
Brash, "UV mutagenic photoproducts in *Escherichia coli* and human cells: A molecular genetics perspective on human skin cancer," Photochem. Photobiol., 1988, 48:59-66.
Cheng et al., "Preparation and hybridization analysis of DNA/RNA from *E. coli* on microfabricated bioelectronics chips," 25 Nature Biotechnol., 1998, 16:541-546.
Dehlinger et al., "Directed hybridization of DNA derivatized nanoparticles into higher order structures," Nano Lett., 2008, 8:4053-4060.
Douglas et al., "Self-assembly of DNA into nanoscale three-dimensional shapes," Nature. May 21, 2009; 459(7245):414-8. doi: 10.1038/nature08016.
Edman et al., "Electric field directed nucleic acid hybridization on microchips," Nucleic Acids Res. Dec. 15, 1997;25(24):4907-14.
Feng et al., "Cinnamate-based DNA photolithography," Nature Mater., 2013, 12:747-753.
Gartner and Bertozzi, "Programmed assembly of 3-dimensional microtissues with defined cellular connectivity," Proc Natl Acad Sci USA Mar. 24, 2009; 106(12):4606-10. doi: 10.1073/pnas. 0900717106. Epub Mar. 9, 2009.
Gilles et al., "Single nucleotide polymorphic discrimination by an electronic dot blot assay on semiconductor microchips," Nat Biotechnol. Apr. 17, 1999(4):365-70.
Gou et al., "Bio-inspired detoxification using 3D-printed hydrogel nanocomposites," Nat Commun. May 8, 2014; 5:3774. doi: 10.1038/ncomms4774.
Gurtner et al., "Microelectronic array devices and techniques for electric field enhanced DNA hybridization in low-conductance buffers," Electrophoresis. May 2002;23(10):1543-50.

(Continued)

*Primary Examiner* — Narayan K Bhat
(74) *Attorney, Agent, or Firm* — Fish & Richardson P.C.

(57) ABSTRACT

This disclosure relates to DNA double-write/double binding identity, and the design and use of DNA double-write materials and methods in processes and systems for macro, micro, and nano-photolithography and self-assembly processes for carrying out two and three dimensional nanofabrication.

13 Claims, 22 Drawing Sheets
(1 of 22 Drawing Sheet(s) Filed in Color)
Specification includes a Sequence Listing.

(56) References Cited

OTHER PUBLICATIONS

Hartmann et al., "Selective DNA attachment of micro- and nanoscale particles to substrates," J Mat Res, 2002, 17(2):473-478.
Heller, "DNA double write photolithography a synergy of top-down and bottom-up nanofabrication," DNA-Based Functional Materials International Symposium, Jena, Germany, May 16, 2014, 16 pages.
Heller, "DNA microarray technology: devices, systems, and applications," Annu Rev Biomed Eng. 2002; 4:129-53. Epub Mar. 22, 2002.
Heller, Integrated Microfabricated Devices: Advanced Technologies for Genomics, Drug Discovery, Bioanalysis, and Clinical Diagnostics, Heller and Guttman, Eds., Marcel Dekker, New York, 2001 [Table of Contents Only].
Hribar et al., "Light-assisted direct-write of 3D functional biomaterials," Lab Chip. Jan. 21, 2014; 14(2):268-75. doi: 10.1039/c3lc50634g. Epub Nov. 20, 2013.
Huang et al., "Dielectrophoretic cell separation and gene expression profiling on microelectronic chip arrays," Anal Chem. Jul. 15, 2002;74(14):3362-71.
Huang et al., "Electric manipulation of bioparticles and macromolecules on microfabricated electrodes," Anal Chem. Apr. 1, 2001;73(7):1549-59.
Huang et al., "Reusable nanostencils for creating multiple biofunctional molecular nanopatterns on polymer substrate," Nano Lett. Sep. 12, 2012; 12(9):4817-22. doi: 10.1021/nl302266u. Epub Aug. 23, 2012.
Kassengne et al., "Numerical modeling of transport and accumulation of DNA on electronically active biochips," Sensors Actuators, 2003, 94:81-98.
London et al., "Effect of pigment on photomediated production of thymine dimers in cultured melanoma cells," J Invest Dermatol. Aug. 1976;67(2):261-4.
Lu et al., "A digital micro-mirror device-based system for the microfabrication of complex, spatially patterned tissue engineering scaffolds," J Biomed Mater Res A. May 2006;77(2):396-405.
Macfarlane et al., "Nanoparticle superlattice engineering with DNA," Science. Oct. 14, 2011; 334(6053):204-8. doi: 10.1126/science.1210493.
Matsunaga et al., "Wavelength dependent formation of thymine dimers and (6-4) photoproducts in DNA by monochromatic ultraviolet light ranging from 150 to 365 nm," Photochem. Photobiol., 1991, 54:403-410.
Mirkin et al., "A DNA-based method for rationally assembling nanoparticles into macroscopic materials," Nature. Aug. 15, 1996;382(6592):607-9.
Noh et al., "50 nm DNA nanoarrays generated from uniform oligonucleotide films," ACS Nano. Aug. 25, 2009; 3(8):2376-82. doi: 10.1021/nn900559m.
Noh et al., "Surface-driven DNA assembly of binary cubic 3D nanocrystal superlattices," Small. Nov. 4, 2011; 7(21):3021-5. doi: 10.1002/smll.201101212. Epub Sep. 8, 2011.
Pinheiro et al., "Challenges and opportunities for structural DNA nanotechnology," Nat Nanotechnol. Nov. 6, 2011; 6(12):763-72. doi: 10.1038/nnano.2011.187.
Sibley and Ahlquist, "The phylogeny of the hominoid primates, as indicated by DNA-DNA hybridization," J Mol Evol. 1984;20(1):2-15.
Sokolov et al., "Direct growth of aligned graphitic nanoribbons from a DNA template by chemical vapour deposition," Nat Commun. 2013; 4:2402. doi: 10.1038/ncomms3402.
Sosnowski et al., "Rapid determination of single base mismatch mutations in DNA hybrids by direct electric field control," Proc Natl Acad Sci USA. Feb. 18, 1997;94(4):1119-23.
Sosnowski et al., "Active microelectronic array system for DNA hybridization, genotyping and pharmacogenomic applications," Psychiatr Genet. Dec. 2002;12(4):181-92.
Takasugi et al., "Sequence-specific photo-induced cross-linking of the two strands of double-helical DNA by a psoralen covalently linked to a triple helix-forming oligonucleotide," Proc Natl Acad Sci USA. Jul. 1, 1991;88(13):5602-6.
Zhang et al., "Patterning of DNA nanostructures on silicon surface by electron beam lithography of self-assembled monolayer," Chem Commun (Camb). Apr. 7, 2004; (7):786-7. Epub Mar. 5, 2004.
Zhao et al., "Stereomask lithography (SML): a universal multi-object micro-patterning technique for biological applications," Lab Chip. Jan. 21, 2011; 11(2):224-30. doi: 10.1039/c0lc00275e. Epub Nov. 26, 2010.
International Search Report and Written Opinion in Application No. PCT/US2014/049227, dated Dec. 10, 2014, 11 pages.
International Preliminary Report on Patentability in Application No. PCT/US2014/049227, dated Feb. 11, 2016, 8 pages.

\* cited by examiner

FIG. 1

Sequence A on the surface : 5'-TTTTTTTTTTTTTTTTTTTCCCGCCCGCCCGCCCG-3'
Sequence B ( with probe): 3'-AAAAAAAAAAAAAAAAAAAA-Cy3-5'
Sequence C ( with probe): 3'-GGGCGGGCGGGCGGGC-Cy3-5'

Part A — Part B

Part B of sequence A
Part A of sequence A

DNA sequence A

DNA sequence A

Covalent attachment onto surfaces

APS modified surface

Covalent attachment onto surfaces

Covalent attachment onto surfaces

| Location 1 | Location 2 | Location 3 | Location 4 |
| Identity A | Identity A | Identity A | Identity A |

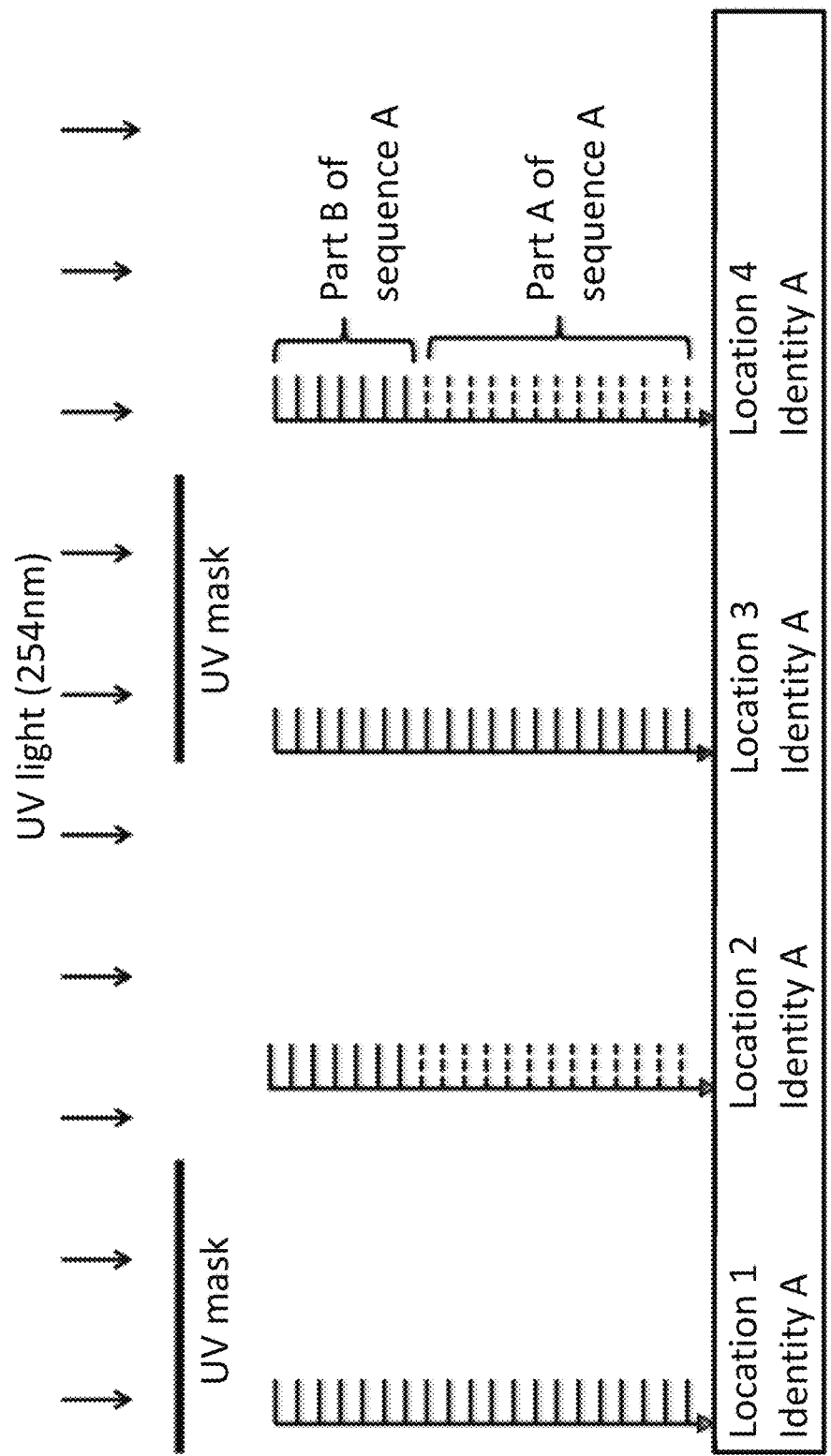

UV light (254nm)

FIG. 13

SEQUENCE A ON THE SURFACE : 5'-TTTTTTTTTTTTTTTTTTTTCCGGCCCGCCCGCCCG-3'    [PART A | PART B]

SEQUENCE B (WITH PROBE) : 3'-AAAAAAAAAAAAAAAAAAAA-Cy3-5'

SEQUENCE C (WITH PROBE) : 3'-GGGCGGGCGGGCGGGC-Cy3-5'

SEQUENCE B' (WITH PROBE) : 3'-AAAAAAAAAAAAAAAAAAAA-Cy3-5' - FLUORESCENT NANOPARTICLES (200 nm RED)

SEQUENCE C' (WITH PROBE) : 3'-GGGCGGGCGGGCGGGC-Cy3-5'  (200 nm, 1um YELLOW)

SEQUENCE B'' (WITH PROBE) : 3'-AAAAAAAAAAAAAAAAAAAA-5' - 5 nm, AUNP (GOLD NANOPARTICLE)
SEQUENCE C'' (WITH PROBE) : 3'-GGGCGGGCGGGCGGGC-5' - 40nm, AUNP (GOLD NANOPARTICLE)

SEQUENCE D (EXTEND SEQUENCE): 3'-GGGCGGGCGGGCGGGCTTTTTTTTTTTTTTTTTTTT-5'    [PART B' (COMPLEMENTARY SEQUENCE WITH PART B ON SEQUENCE A) | PART A' (SECONDARY WRITING SEQUENCE)]

FIG. 15

DNA DOUBLE WRITE PHOTOLITHOGRAPHY

FWS: ID-1 & ID-2   5'-TTT-TTT-TTT-TTT-TTT-TTT-(ID-1)-CCC-GCC-CGC-CGC-CCG-CCC-G-(ID-2)-3'
ID-1-RF-CP         3'-A-AAA-AAA-AAA-GGG-CGG-5'-ALEXA546
ID-2-GF-CP         3'-GGG-CGG-GCG-GGG-GGG-C-5'-ALEXA488

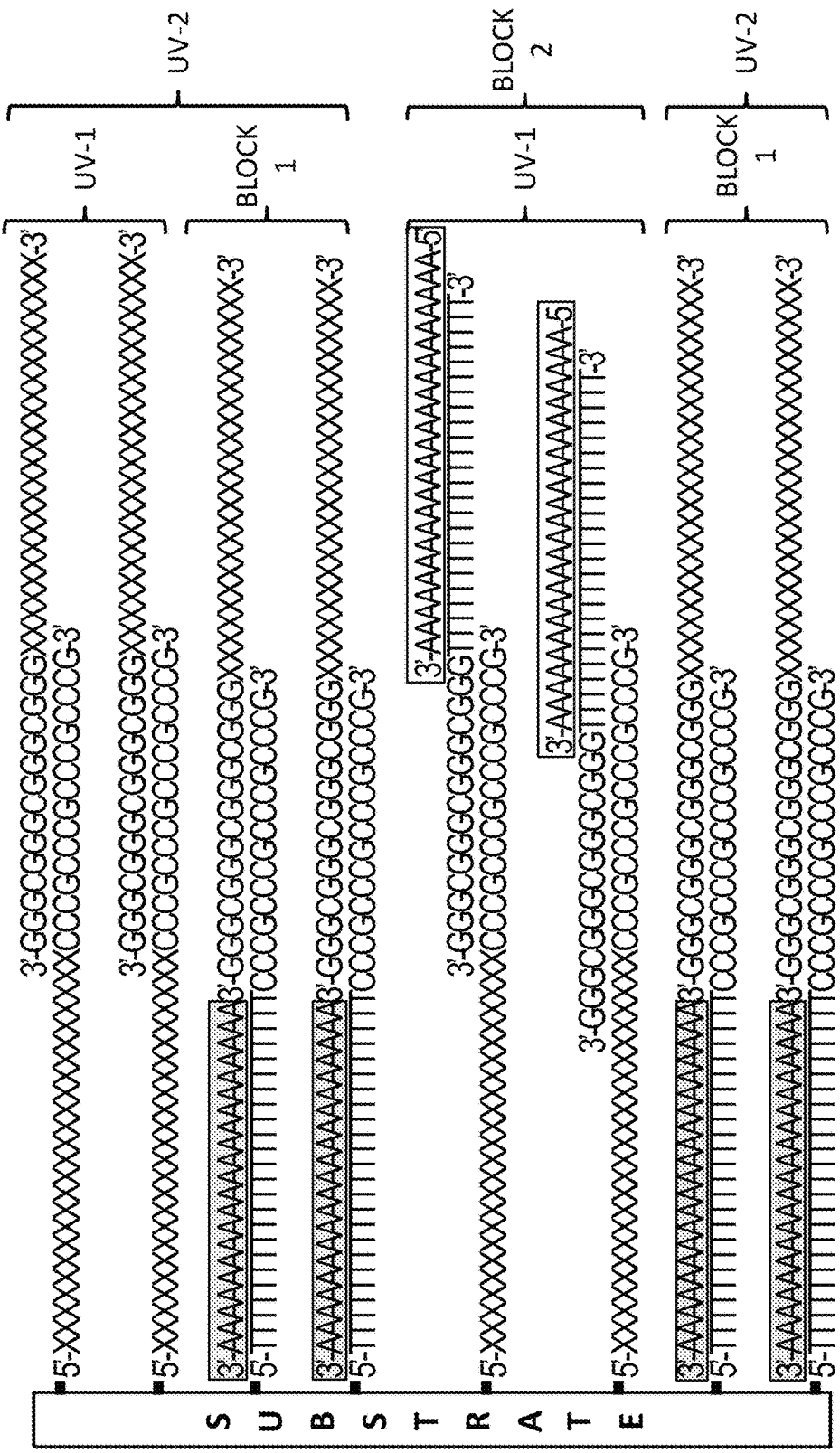

DNA DOUBLE WRITE PHOTOLITHOGRAPHY – SECOND WRITE LEVEL (1) SECOND LEVEL WRITE PROBE
(2)
(3) SECOND LEVEL FLUORESCENT(4) COMPLEMENTARY PROBE

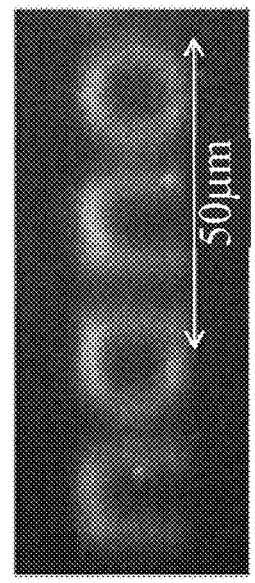
FIG. 19A
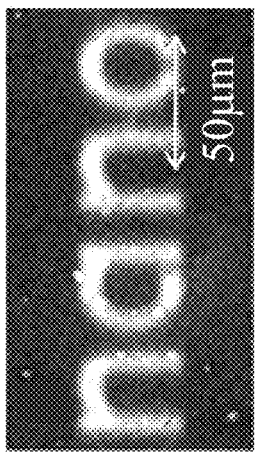
FIG. 19B
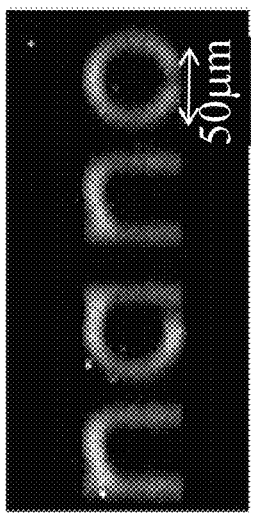
FIG. 19C
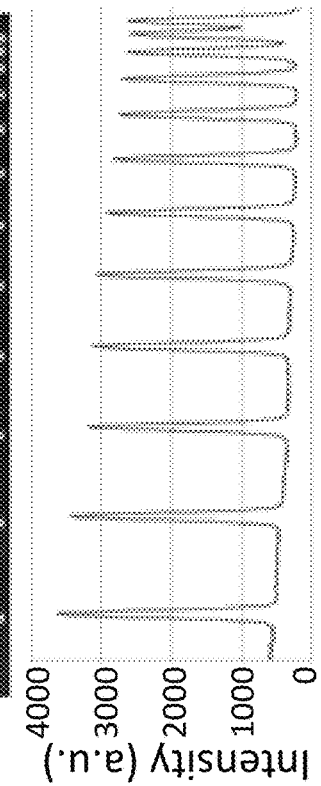
FIG. 19D
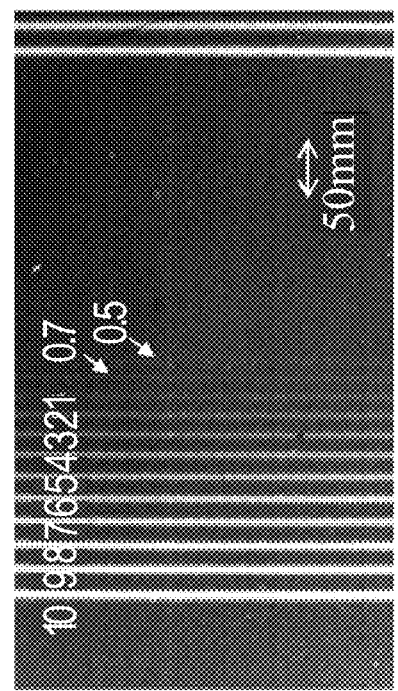
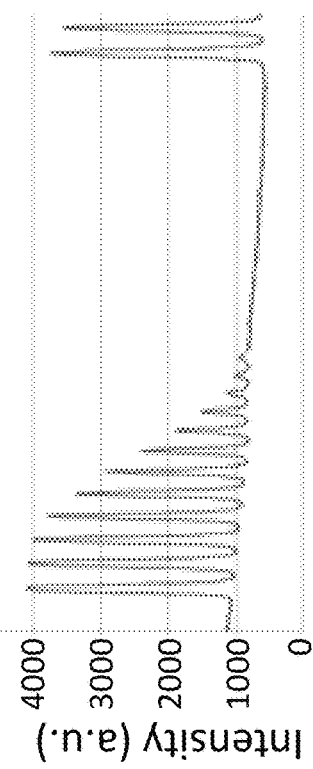
FIG. 19E

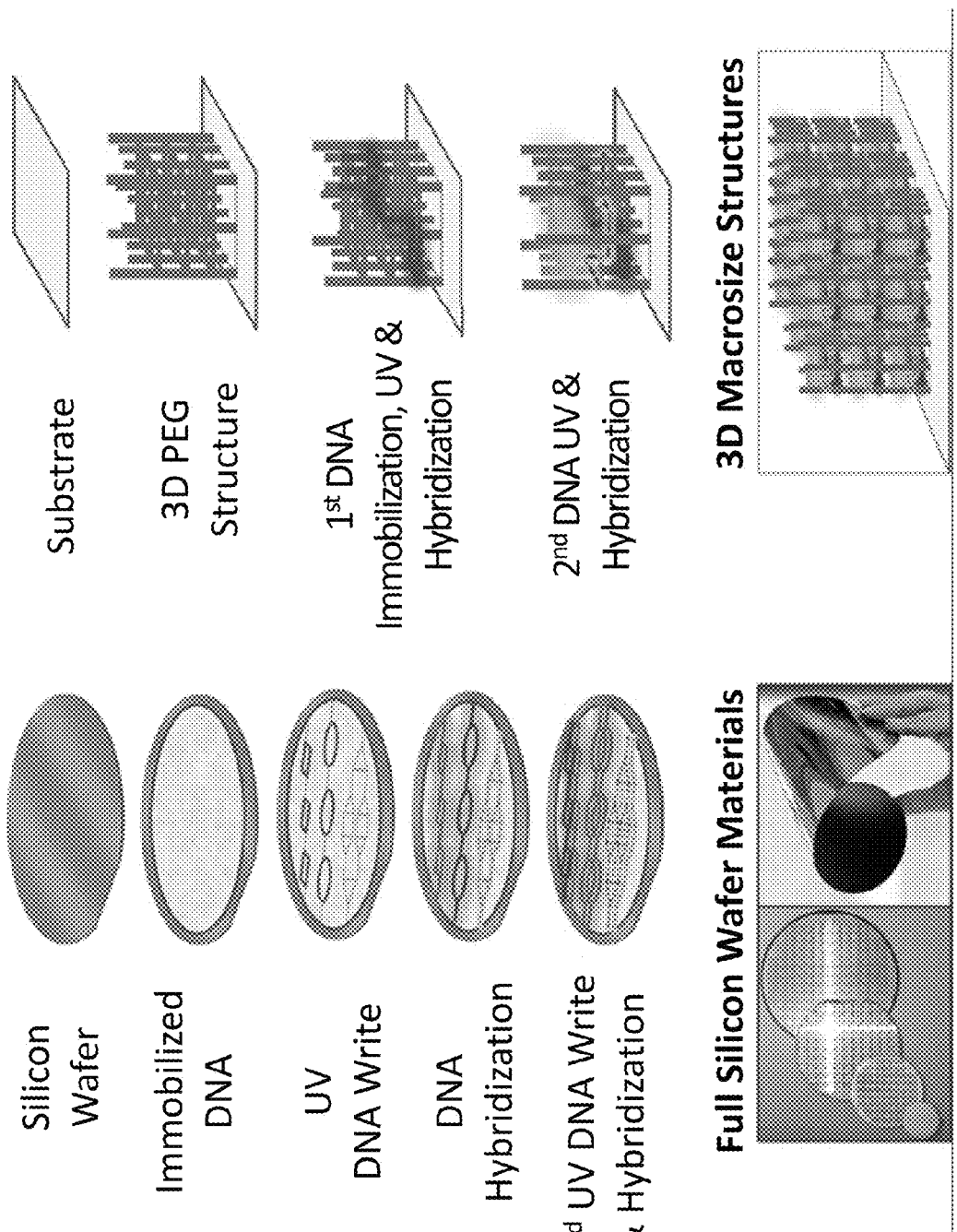
FIG. 20A 2D DNA Fab
FIG. 20B 3D DNA Fab

SEQUENCE LISTING

<160> NUMBER OF SEQ ID NOS: 11

<210> SEQ ID NO 1
<211> LENGTH: 40
<212> TYPE: DNA
<213> ORGANISM: Artificial Sequence
<220> FEATURE:
<223> OTHER INFORMATION: synthetic oligonucleotide

```
<400> SEQUENCE: 1
tttttttttt tttttttttt ttttcccgcc cgcccgcccg                         40

<210> SEQ ID NO 2
<211> LENGTH: 24
<212> TYPE: DNA
<213> ORGANISM: Artificial Sequence
<220> FEATURE:
<223> OTHER INFORMATION: synthetic oligonucleotide

<400> SEQUENCE: 2
aaaaaaaaaa aaaaaaaaaa aaaa                                          24

<210> SEQ ID NO 3
<211> LENGTH: 16
<212> TYPE: DNA
<213> ORGANISM: Artificial Sequence
<220> FEATURE:
<223> OTHER INFORMATION: synthetic oligonucleotide

<400> SEQUENCE: 3
cgggcgggcg ggcggg                                                   16

<210> SEQ ID NO 4
<211> LENGTH: 40
<212> TYPE: DNA
<213> ORGANISM: Artificial Sequence
<220> FEATURE:
<223> OTHER INFORMATION: synthetic oligonucleotide

<400> SEQUENCE: 4
tttttttttt tttttttttt ttttcgggcg ggcgggcggg                         40

<210> SEQ ID NO 5
<211> LENGTH: 16
<212> TYPE: DNA
<213> ORGANISM: Artificial Sequence
<220> FEATURE:
<223> OTHER INFORMATION: synthetic oligonucleotide

<400> SEQUENCE: 5
ggcgggaaaa aaaaaa                                                   16

<210> SEQ ID NO 6
<211> LENGTH: 39
<212> TYPE: DNA
<213> ORGANISM: Artificial Sequence
<220> FEATURE:
<223> OTHER INFORMATION: synthetic oligonucleotide

<400> SEQUENCE: 6
tttttttttt tttttttttt ttttgggcgg gcgggcggg                          39

<210> SEQ ID NO 7
<211> LENGTH: 40
<212> TYPE: DNA
<213> ORGANISM: Artificial Sequence
<220> FEATURE:
<223> OTHER INFORMATION: synthetic oligonucleotide

<400> SEQUENCE: 7
tttttttttt tttttttttt ttttgggcgg gcgggcgggc                         40

<210> SEQ ID NO 8
<211> LENGTH: 13
```

```
<212> TYPE: DNA
<213> ORGANISM: Artificial Sequence
<220> FEATURE:
<223> OTHER INFORMATION: synthetic oligonucleotide

<400> SEQUENCE: 8
cctgtctgtc ctg                                                           13

<210> SEQ ID NO 9
<211> LENGTH: 37
<212> TYPE: DNA
<213> ORGANISM: Artificial Sequence
<220> FEATURE:
<223> OTHER INFORMATION: synthetic oligonucleotide

<400> SEQUENCE: 9
aaaaaaaaaa aaaaaaaaaa aaaacaggac agacagg                                 37

<210> SEQ ID NO 10
<211> LENGTH: 17
<212> TYPE: DNA
<213> ORGANISM: Artificial Sequence
<220> FEATURE:
<223> OTHER INFORMATION: synthetic oligonucleotide

<400> SEQUENCE: 10
gggcgggaaa aaaaaaa                                                       17

<210> SEQ ID NO 11
<211> LENGTH: 16
<212> TYPE: DNA
<213> ORGANISM: Artificial Sequence
<220> FEATURE:
<223> OTHER INFORMATION: synthetic oligonucleotide

<400> SEQUENCE: 11
gggcgggcgg gcgggc                                                        16
```

DNA DOUBLE-WRITE/DOUBLE BINDING IDENTITY

CROSS-REFERENCE TO RELATED APPLICATIONS

This application is a National Stage Application under 35 U.S.C. § 371 and claims the benefit of International Application No. PCT/US2014/049227, filed Jul. 31, 2014, which claims benefit of priority from U.S. Provisional Application Ser. No. 61/860,508, filed on Jul. 31, 2013.

STATEMENT AS TO FEDERALLY SPONSORED RESEARCH

This invention was made with government support under CMMI-1120795, awarded by the National Science Foundation. The government has certain rights in the invention.

TECHNICAL FIELD

This disclosure relates to DNA double-write/double binding identity, and the use of DNA double-write methods in processes that combine top-down photolithographic and bottom-up self-assembly processes for the fabrication of two and three dimensional nanoscale, microscale and macroscale higher order structures, materials, and devices.

BACKGROUND

A synergy for combining top-down and bottom-up technologies for viable nanomanufacturing has long been a major challenge for advancing nanotechnology (see, e.g., "Small Wonders: Endless Frontiers," Publication from the National Research Council on the review of the National Nanotechnology Initiative, 2002). In a similar vein, for decades there have been great expectations regarding novel applications of DNA, ranging from 3D self-assembly of DNA nanoparticle structures to DNA nanoelectronic computing (Pinheiro et al., Nature Nanotech 6:763-772, 2011). While some of the more biotech-related applications have materialized, most of the non-classical DNA applications have not.

SUMMARY

This document is based at least in part on the development of a truly viable, DNA based top-down (photolithographic) and bottom-up (self-assembly) process is necessary for achieving scalable nano/micro/macrofabrication, and ultimately for the manufacture of novel materials, structures, and devices. Thus, provided herein are DNA double-write/double binding identity materials that can be used in processes such as, without limitation, photolithographic microfabrication.

In one aspect, this document features a method for DNA double-writing. The method can include (a) immobilizing onto a substrate material a DNA write sequence containing a first segment that contains from 10% to 100% thymine bases, and a second segment that contains no more than 10% thymine bases; (b) exposing the immobilized DNA write sequence to radiation using a first pattern mask or directed write beam to generate an irradiated area and a non-irradiated area of the substrate, such that thymine bases in the DNA write sequence within the irradiated area will no longer hydrogen bond to complementary adenine bases; and (c) contacting the immobilized DNA write sequence with a first complementary nucleic acid sequence that hybridizes to the immobilized DNA write sequence in the non-irradiated area, and contacting the immobilized DNA write sequence with a second complementary nucleic acid sequence that hybridizes to the immobilized DNA write sequence in the irradiated area, thus generating a first DNA layer.

The DNA write sequence can be single stranded nucleic acid sequence that is 16 to 500 nucleotides in length, or 20 to 100 nucleotides in length. The first segment of the DNA write sequence can contain from 10% to 100% thymine bases. The thymine bases can be in groups of two or more, and can be scattered within the first segment. The second segment of the DNA write sequence may contain no thymine bases. The DNA write sequence can be immobilized on the substrate by covalent attachment (e.g., through a homobifunctional crosslinker). The substrate can be silicon, glass, or plastic. The radiation can be ultraviolet radiation (e.g., ultraviolet radiation at a wavelength of 254 nm). The exposing step can include using a digital projection patterning system.

The first complementary DNA sequence can be specifically designed to hybridize to the first segment of the DNA write sequence that contains from 10% to 100% thymine bases. The second complementary DNA sequence can be specifically designed to hybridize to the second segment of the DNA write sequence that contains no more than 10% thymine bases. The first complementary DNA sequence can have a sequence extension that overlaps with and is identical to a section of the second complementary DNA sequence. The sequence extension can be from two to 50 nucleotides in length (e.g., from three to 30 nucleotides in length, or from four to 20 nucleotides in length). One or both of the first and second complementary DNA sequences can be derivatized (e.g., with one or more fluorophores, quantum dots, nanoparticles, nanocomponents, peptides, proteins, polymers, biopolymers, binding entities, or crosslinking entities, such as binding or crosslinking entities selected from the group consisting of amines, thiols, biotin, and psoralens). One or both of the first and second complementary DNA sequences can have an additional DNA sequence beyond the complementary sequence, where the additional DNA sequence is not complementary to the immobilized DNA write sequence.

The method can further include (d) contacting the first DNA layer with one or more further complementary DNA sequences containing second and/or third DNA write sequences, each of which includes a first segment that contains 10% to 100% thymine bases and/or a second segment that contains no more than 10% thymine bases; (e) exposing the DNA on the substrate to radiation using a second pattern mask or directed write beam to generate an irradiated area and a non-irradiated area of the substrate, such that thymine bases in the DNA write sequence within the irradiated area will no longer hydrogen bond to complementary adenine bases; and (f) contacting the immobilized DNA with third and fourth complementary DNA sequences that hybridize to the DNA write sequences in the non-irradiated areas of the substrate, and contacting the immobilized DNA with fifth and sixth complementary DNA sequences that hybridize to the DNA write sequences in the non-irradiated areas of the substrate, thus generating a second DNA layer.

The method can further include (g) contacting the second DNA layer with one or more further complementary DNA sequences containing fourth and/or fifth DNA write sequences, each of which includes a first segment that contains 10% to 100% thymine bases and/or a second segment that contains no more than 10% thymine bases; (h) exposing the DNA on the substrate to radiation using a third pattern mask or directed write beam to generate an irradiated area and a non-irradiated area of the substrate, such that thymine bases in the DNA write sequence within the irradiated area will no longer hydrogen bond to complementary adenine bases; and (i) contacting the immobilized DNA with seventh, eighth, ninth and tenth complementary DNA sequences that hybridize to the DNA write sequences in the non-irradiated areas of the substrate, and contacting the immobilized DNA with eleventh, twelfth, thirteenth, an fourteenth complementary DNA sequences that hybridize to the DNA in the irradiated areas of the substrate, thus generating a third DNA layer.

The method can include producing a heterogeneous two dimensional material with macroscale, microscale, or nanoscale features, or producing a heterogeneous three dimensional layered material using electric field directed hybridization and self-assembly fabrication.

In another aspect, this document features a photolithographic material that includes a solid substrate with DNA immobilized thereon, where the sequence of the DNA contains thymine bases at predetermined positions that allow the DNA to be used in a double-write method. The DNA can be immobilized on the substrate by covalent attachment (e.g., through a homobifunctional crosslinker). The substrate can be silicon, glass, or plastic.

Unless otherwise defined, all technical and scientific terms used herein have the same meaning as commonly understood by one of ordinary skill in the art to which this invention pertains. Although methods and materials similar or equivalent to those described herein can be used to practice the invention, suitable methods and materials are described below. All publications, patent applications, patents, and other references mentioned herein are incorporated by reference in their entirety. In case of conflict, the present specification, including definitions, will control. In addition, the materials, methods, and examples are illustrative only and not intended to be limiting.

The details of one or more embodiments of the invention are set forth in the accompanying drawings and the description below. Other features, objects, and advantages of the invention will be apparent from the description and drawings, and from the claims.

DESCRIPTION OF DRAWINGS

The patent or application file contains at least one drawing executed in color. Copies of this patent or patent application publication with color drawing(s) will be provided by the Office upon request and payment of the necessary fee.

FIG. 1 shows a starting substrate material to which initial DNA write sequence A (SEQ ID NO:1) is covalently attached. FIG. 1 also shows complementary DNA sequences B (SEQ ID NO:2) and C (SEQ ID NO:3), also called DNA "probe sequences," which can be selectively hybridized to the DNA write sequence after masking and exposure to UV. Both of the complementary DNA (probe) sequences are labelled with a Cy3 fluorescent dye.

FIG. 2 shows the starting substrate material to which the initial or first DNA write sequence A (SEQ ID NO:1) containing a sequence A section and sequence B section is covalently attached. The substrate with the immobilized first DNA write sequence is then masked and exposed to UV irradiation at 254 nm. Complementary sequences B (SEQ ID NO:2) and C (SEQ ID NO:3) also are shown.

FIG. 3 also shows, after masking and UV exposure, the hybridization of first complementary DNA probe sequence B (SEQ ID NO:2) derivatized with a Cy3 fluorescent dye to the immobilized DNA write sequence on the section of the substrate that was not exposed to UV; and also shows hybridization of second complementary DNA probe sequence C (SEQ ID NO:3) derivatized with a Cy3 fluorescent dye to the immobilized DNA write sequence on the section of the substrate that was exposed to UV. The fluorescent images are actual results demonstrating the initial DNA double write process.

FIG. 13 shows ss-DNA write sequence A (SEQ ID NO:1) and complementary probe sequences labelled with Cy3 fluorophores (B, SEQ ID NO:2; C, SEQ ID NO:3), 200 nm red fluorescent nanoparticles (B', SEQ ID NO:2), 200 nm yellow fluorescent nanoparticles (C', SEQ ID NO:3), and 40 nm gold nanoparticles (B", SEQ ID NO:2; and C", SEQ ID NO:3), as well as a complementary DNA probe sequence (D; SEQ ID NO:4) with an extended write sequence.

shows

FIG. 15 shows the first DNA write sequence (FWS: ID-1&ID-2; SEQ ID NO:1) and two specific complementary DNA probe sequences. ID-1-RF-CP is a red fluorescent (Alexa546) probe sequence (SEQ ID NO:5) that hybridizes to the ID-1 section of the write sequence, and contains an overlap of six nucleotides to produce a "displacer effect." ID-2-GF-CP is a green fluorescent (Alexa488) probe sequence (SEQ ID NO:3) that hybridizes to the ID-2 section of the write sequence. After UV irradiation, hybridization of the ID-2-GF-CP probe sequence to the blocked/masked areas that were not UV irradiated is prevented by the displacer effect of the ID-1-RF-CP probe sequence. Thymine bases exposed to UV irradiation and inactivated by dimerization are shown as X.

FIG. 16a is a schematic showing specialized DNA sequences and a UV masking and hybridization procedure for DNA double writing. In step (1), the first DNA writing sequence (FWS: ID-1&ID-2) containing ID-1 and ID-2 immobilized on a glass substrate surface has the sequence 5'-TTTTTTTTTTTTTTTTTTTTTTTTTC-CCGCC CGCCCGCCCG-3' (SEQ ID NO:1). In step (2), a photomask is placed over the DNA substrate, which is then exposed to deep UV light (254 nm) for 5 minutes. In step (3), the first complementary probe, ID-1-RF-CP (3'-AAAAAAAAAAGGGCGG-5' (SEQ ID NO:5), labeled at the 5' end with an Alexa Fluor 546 orange/red fluorophore) is hybridized onto the patterned UV substrate, and the substrate is then washed with buffer. In step (4), the second complementary probe, ID-2-GF-CP (3'-GGGCGGGCG GGCGGGC-5' (SEQ ID NO:3) labelled at the 5' end with an Alexa Fluor 488 green fluorophore) is hybridized onto the patterned UV substrate, and the substrate is washed with buffer. FIG. 16b is a black and white fluorescent image (ex 555 nm, em 571 nm) in which the hybridized ID-1 red fluorescence complementary probe ID-1-RF-CP appears as white letters on a black background. FIG. 16c is a black and white fluorescent image (ex 492 nm, em 517 nm) in which the hybridized ID-2 green fluorescence complementary probe ID-2-GF-CP appears as a white background with darker letters. FIG. 16d is a complete image with red fluorescent letters and a green fluorescent background, albeit shown in black and white. FIGS. 16e, 16f, 16g, and 16h are other UV patterned images generated using the DNA double write photolithographic process.

FIG. 17 shows first and second DNA write sequences (FWS: ID-1&ID-2 (SEQ ID NO:1) and SWS: ID-3&ID-4 (SEQ ID NO:6)) and specific complementary DNA probe sequences (ID-1-FR-CP and ID-4-GF-CP (both SEQ ID NO:2)) used for a DNA double write process with an additional second level write. Thymine bases exposed to UV irradiation and inactivated by dimerization are shown as X.

FIG. 18a is a schematic with representations of specialized DNA sequences, UV masking, and a hybridization procedure for DNA double writing with a second level write. In step (1), the first DNA writing sequence (FWS: ID1&ID2, having the sequence 5'-TTTTTTTTTTTTTTTTTTTTTTTTCCCGCCCGC CCGCCCG-3' (SEQ ID NO:1)) is immobilized on a glass substrate surface. A photomask is placed over the DNA substrate, which is then exposed to deep UV light (254 nm) for 5 minutes. A red fluorescent complementary probe sequence (5'-Alexa546-AAAAAAAAAAAAAAAAAAAAAAAA-3'; SEQ ID NO:2) is hybridized onto the patterned UV substrate. A second level write sequence (SWS: ID-1&ID-3, having the sequence 5'-TTTTTTTTTTTTTTTTTTTTTTTTGGGCGGGCG GGCGGGC-3' (SEQ ID NO:7)) is hybridized to the substrate. In step (2), a second level UV photomasking is carried out. In step (3), a green fluorescent complementary probe (5'-Alexa488-AAA AAAAAAAAAAAAAAAAAAAA-3' (SEQ ID NO:2)) is hybridized to the substrate. In step (4), the red fluorescent and green fluorescent probes are hybridized to the first level and second level write sequences, respectively. FIG. 18b shows a false color fluorescent image of the first and second level writes, where the red fluorescent complementary probe is hybridized to the ID-1 segment of the FWS: ID-1&ID-2 sequence and the green fluorescent complementary probe ID-3-GF-CP probe is hybridized to the ID-3 segment of the SWS: ID-1 & ID-3 sequence. FIG. 18c is a false color fluorescent image of the first and second level writes, where the red fluorescent complementary probe (5'-Alexa546-AAAAAAAAAAAAAAAAAAAAAAAA-3' (SEQ ID NO:2) is hybridized to the ID-1 segment of the FWS: ID-1&ID-2 sequence, and a far-red fluorescent complementary probe (5'-Alexa647-CCTGTCTGTCCTG-3' (SEQ ID NO:8)) is hybridized to the ID-5 segment of a short sequence probe (SSP: ID-4&ID-5, having the sequence 5'-AAAAAAAAAAAAAAAAAAAAAAAACA-GGACAGACAG G-3' (SEQ ID NO:9)). FIG. 18d is a false color fluorescent image of the first and second level write where the green fluorescent complementary probe (5'-Alex 488-AAAAAA AAAAAAAAAAAAAAAAAAA-3' (SEQ ID NO:2) is hybridized to the ID-1 segment of the FWS: ID-1&ID-2 sequence, and an orange/red fluorescent complementary probe constructed from 5' Biotin-AAAAAAAAAAAAAAAAAAAAAAAA-3' (SEQ ID NO:2) subsequently labeled with Cy-3 streptavidin is hybridized to the ID-1 section of the SWS: ID-1&ID-3 sequence.

FIGS. 19a-e show double write line widths and resolution. Line widths for letters are 10 μm (FIG. 19a), 5 μm (FIG. 19b), and 2.5 μm (FIG. 19c); the scale bar is 50 μm. The write patterns were hybridized with the red fluorescent probe 5'-Alex 546-AAAAAAAAAAAAAAAAAAAAAAAA-3' (SEQ ID NO:2). FIG. 19d shows patterned lines with widths ranging from 10 μm to 500 nm, and with 20 μm spacing gaps. The scale bar is 50 μm. The lower graph shows a scanned fluorescent intensity measurement of the image above. FIG. 19e shows 10 μm lines with spacing gaps ranging from 100 μm to 5 μm; the scale bar is 50 μm. The lower graph shows a scanned fluorescent intensity measurement of the image above.

FIGS. 20A and 20B are diagrams showing DNA double write 2D and 3D processes for nanofabrication and scalable nanomanufacturing. The 2D DNA process (FIG. 20A) involves immobilization of the first DNA write sequences onto a glass or silicon wafer substrate. The substrate is masked, exposed to UV, and hybridized with two different complementary DNA sequences. The DNA sequences are designed to hybridize to the immobilized DNA that was UV-exposed and to the DNA in the un-exposed (masked) areas. The complementary DNA sequences can be modified with a variety of entities (fluorophores, nanoparticles, etc.). The process can be repeated to produce multiple layers of different DNA structures and patterns. The 3D DNA process (FIG. 20B) involves starting with a glass substrate onto which the DPP system is used to create a porous 3D matrix from polyethylene glycol diacrylate (PEGDA) impregnated with biotin-dextran. Biotinylated DNA write sequences are attached to the 3D matrix by biotin-streptavidin ligation. The DDP system is now used to produce the desired 3D pattern for complementary DNA sequences to hybridize within the 3D PEGDA porous matrix. The process can be repeated to carry out the formation of additional PEGDA matrices, and for further DNA patterning and self-assembly via hybridization, leading to formation of large 3D X-Y-Z structures with macroscopic dimensions.

DETAILED DESCRIPTION

Figure 3:
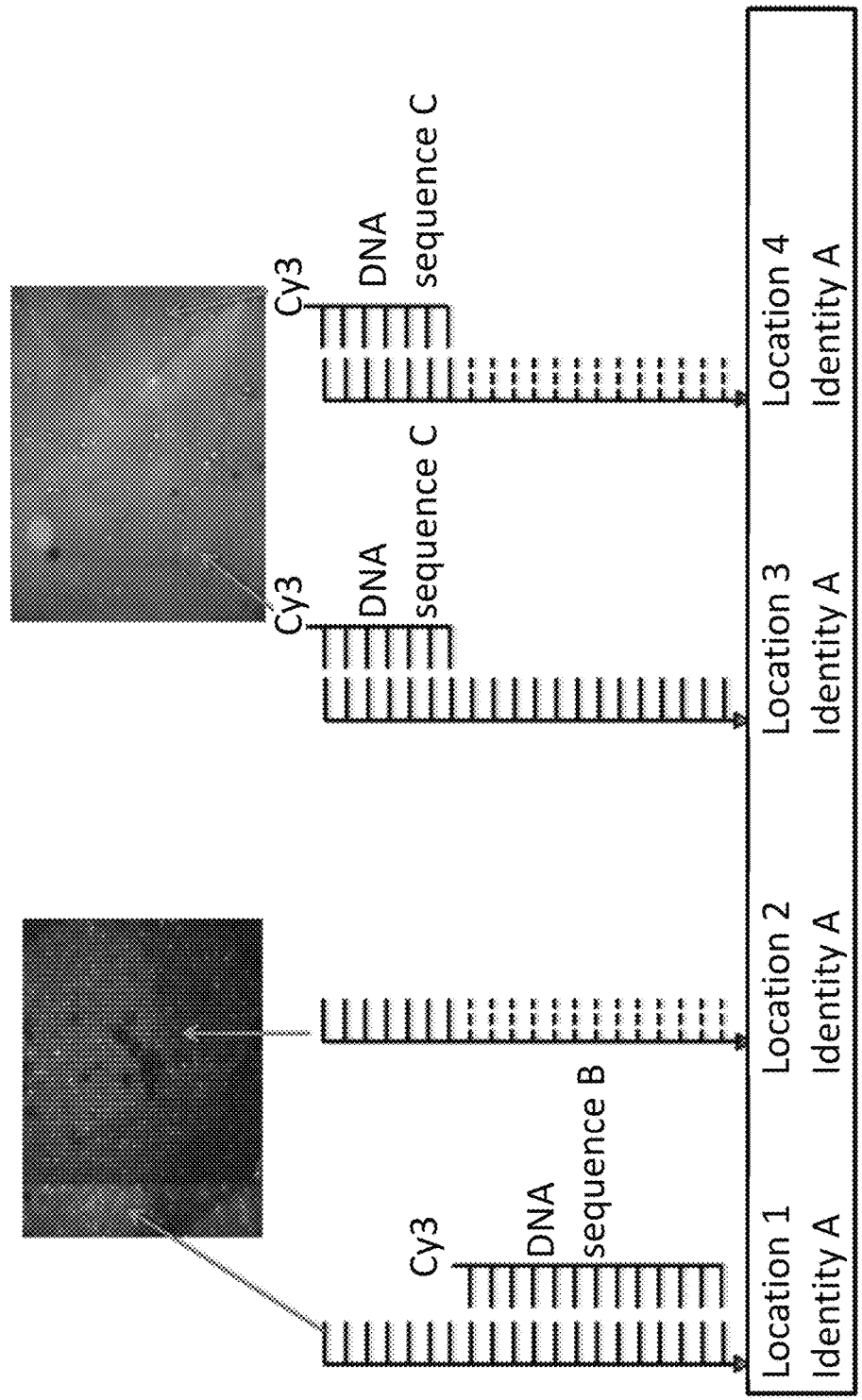
FIG. 3 shows the starting substrate material to which initial DNA write sequence A (SEQ ID NO:1) is covalently attached.

DNA is an intrinsically programmable biomolecule due to its base sequence, which can self-assemble via Watson-Crick base pairing hybridization of complementary DNA sequences, and can be patterned by photolithograph methods (e.g., through the sensitivity of the thymine bases to UV radiation). Additionally, DNA, RNA, PNA (peptide nucleic acid), and other types of nucleic acids can be readily synthesized in large amounts and derivatized with a variety of fluorophores, chromophores, nanoparticles, and/or other entities. Thus, DNA and nucleic acids in general have potential for both top-down photolithographic and bottom-up self-assembly nanofabrication.

The synergy for top-down and bottom-up fabrication is a major advantage not found in any other basic starting materials, making DNA an ideal substrate material and functional component material for scalable nanofabrication processes. Further, while DNA can be a stand-alone fabrication material, it also can be used in conjunction with other photolithographic processes (e.g., complementary metal oxide semiconductor (CMOS) and soft lithography) and self-assembly materials and components (e.g., protein-ligands, aptamers, and dendrimers).

In addition to the more conventional UV photolithographic techniques used by the microelectronics industry that utilize masks, new mask-less techniques are now becoming available. One new mask-less "reflected" projection photolithography technique uses a digital micro-mirror array to spatially control light to a given z-focus by reflecting digital images of light through optics to be focused onto a stage. This digital mirror device (DMD) is comprised of a digital light projection (DLP) MEM device from Texas Instruments that is used in conjunction with precision stages, conventional light optics, and one or more light sources capable of producing several specific wavelengths of light (Gou et al., *Nature Comm* 5: 3774, 2014; Hribar et al., *Lab on a Chip* 14(2):268-275, 2014; and Lu et al., *J Biomed Mater Res* 77A(2):396-405, 2006).

DNA, RNA, PNA and other nucleic acids can be ideal for creating a wide variety of nanoscale structures that can be interconnected and integrated to form larger homogeneous or more complex heterogeneous higher-order 2D and 3D structures, materials, and devices. Intrinsic programmability and other unique properties of DNA allow it to be used as a self-assembly nanostructure material, which can be functionalized with nanoparticles (Macfarlane et al., *Science* 334:204-208, 2011; Mirkin et al., *Nature* 382:607-609, 1996; and Noh et al., *Small* 7:3021-3025, 2011) and patterned by a variety of methods (Sibley and Ahlquist, *J Molec Evol* 20:2-15, 1984; Gartner and Bertozzi, *Proc Natl Acad Sci USA* 106:4606-4610, 2009; and Sokolov et al., *Nature Commun* 4:1-8, 2013). Thus, DNA has considerable potential for both top-down photolithographic and bottom-up self-assembly nanofabrication. In spite of decades of effort, however, there have been few if any viable applications for this type of DNA technology. A major limitation for ultraviolet (UV) patterning methods where DNA itself is the write substrate is that hybridization of complementary DNA sequences can only be carried out in patterned areas that have not been exposed to UV irradiation (see, U.S. Pat. No. 6,652,808). This technique, which can be described as a UV single-write method, greatly restricts the full potential of DNA to be used for programmed self-assembly after patterning.

In contrast, this document provides a DNA double-write process, in which UV patterning with two distinct binding identities are produced, allowing two different complementary DNA sequences to be hybridized. This permits further DNA based self-assembly, as well as further UV patterning to be carried out in both the UV exposed and non-exposed areas. Functional biomaterials based on DNA can allow both patterning and subsequent self-assembly through the base sequence information in the DNA strand. DNA oligonucleotide sequences with a length of just 20 bases (1.25 nm×6 nm in size) can provide a huge number ($>10^9$) of highly specific nanoscale sequences, each with a unique binding identity. Self-assembly by hybridization of complementary DNA sequences derivatized with fluorophores, nanoparticles, and other entities is a rapid and simple process, particularly as compared to other methods using chemical binding agents. For example, DNA detection and analysis technologies using derivatized DNA entities include microarray genotyping devices (Kassengne et al., *Sensors Actuators* 94:81-98, 2003; Gurtner et al., *Electrophoresis* 23:1543-1550, 2002; Sosnowski et al., *Psychiatr Genet* 12:181-192, 2002; Huang et al., *Anal Chem* 74:3362-3371, 2002; Hartmann et al., *J Mat Res* 17(2):473-478, 2002; Heller, *Ann Rev Biomed Eng* 4:129-153, 2002; Huang et al., *Analyt Chem* 73:1549-1559, 2001; Heller, *Integrated Microfabricated Devices: Advanced Technologies for Genomics, Drug Discovery, Bioanalysis, and Clinical Diagnostics*, Heller and Guttman, Eds., Marcel Dekker, New York, 2001; Cheng et al., *Nature Biotechnol* 16:541-546, 1998; Edman et al., *Nucl Acids Res* 25(24):4907-4914, 1997; and Sosnowski et al., *Proc Natl Acad Sci USA* 94:1119-1123, 1997), and DNA chips with CMOS control for single nucleotide polymorphism (SNP) discrimination genotyping (Gilles et al., *Nat Biotechnol* 17:365-370, 1999). A range of other techniques for DNA patterning include nano-imprinting (Noh et al., *ACS Nano* 3:2376-2382, 2009), silk screen patterning (Zhao et al., *Lab Chip* 11:224-230, 2010), electrical field directed self-assembly (Dehlinger et al., *Nano Lett* 8:4053-4060, 2008), and e-beam lithography (Zhang et al., *Chem Commun* 786-787, 2004).

Viable UV photolithographic based methods for DNA patterning, as provided herein, can have other advantages. These include, without limitation: (1) integrating well with established semiconductor manufacturing processes; (2) having a high potential for uniformity and consistency; (3) having the ability to produce macro-size patterns with micron and/or nanometer scale features; and (4) being able to produce heterogeneous layered 3D structures. Other UV techniques for DNA patterning have utilized psoralen conjugated nucleotides to produce cross-linking between two DNA strands (Takasugi et al., *Proc Natl Acad Sci USA* 88:5602-5606, 1991) and cinnamate conjugated DNA sequences to produce inter-strand cross-linking (Feng et al., *Nature Mater* 12:747-753, 2013). These studies were in essence single-write UV techniques in which hybridized DNA strands were immobilized using specialized chemical reagents that are reactive to UV light. Even earlier work involved the use of the DNA itself as a single-write material for UV photolithographic patterning (see, e.g., U.S. Pat. No. 6,652,808). Unlike the other methods, this approach used UV irradiation to essentially prevent DNA hybridization through thymine base dimerization. This process in nature is a cause of melanoma (London et al., *J Invest Dermatol* 67:261-264, 1976) and DNA mutations in other skin cancers (Brash, *Photochem Photobiol* 48:59-66, 1988). The mechanism for blocking DNA hybridization by UV induced thymine dimerization involves exposure of DNA containing thymine bases to short wavelength (~254-260 nm) UV light, causing thymine dimer formation (in particular, cyclobutane pyrimidine dimers, 6-4 photoproduct; Matsunaga et al., *Photochem Photobiol* 54:403-410, 1991. Thymine dimerization prevents hydrogen bonding to adenine bases in the complementary DNA sequence. If thymine bases constitute more than 10-20% of the full DNA sequence, then hybridization of a complementary DNA strand can be completely inhibited.

In the past, there have been great expectations regarding novel applications of DNA, including 3D DNA self-assembly and DNA nanoparticle self-assembly (Douglas et al., *Nature* 459:414-418, 2009; and Huang et al., *Nano Lett* 12:4817-4822, 2012; and Pinheiro et al., supra). While some of the biotech-related applications (e.g., genomic microarrays) have materialized, most of the non-classical applications have not. The DNA double write/double identity processes disclosed herein represents a true synergy of top-down and bottom-up technologies. These new processes overcome limitations of other UV photolithographic and self-assembly techniques, and allow DNA to be the used as a viable nanofabrication material.

This document relates to novel double write/double binding identity nucleic acid materials (e.g., DNA, RNA, PNA, and other modified nucleic acid entities) in which thymine bases are placed at specific locations, and to methods of using the nucleic acid materials in processes such as, without limitation, photolithographic microfabrication. In particular, the specifically positioned thymine bases can allow the nucleic acids to be used as double write/double identity photolithographic materials for macro, micro and nanolithographic patterning, with subsequent hybridization-based self-assembly for scalable two and three dimensional nanofabrication. The specially designed nucleic acid write sequences can be attached to or immobilized on the surface of a suitable substrate material (e.g., silicon, glass, mica, or plastic) to form a basic photolithographic double write material. In some embodiments, nucleic acid write sequences also can be attached to or immobilized within preformed porous 3D structures, such as polyethylene glycol (PEG), agarose, polyacrylamide, or other soft or hard hydrogel type materials.

Using a photolithography (mask) process and/or a directed write beam (mask-less) process, the surface can be exposed to radiation (e.g., UV and/or Vis), which can modify the thymine bases in such a way that they no longer hydrogen bond to complementary adenine bases via Watson-Crick base pairing. The unique design of the immobilized DNA write sequence, loss of thymine hydrogen bonding upon exposure to radiation, and controlled hybridization conditions can allow for subsequent hybridization by two different specially designed complementary DNA sequences. For example, a first specific complementary DNA sequence can be hybridized to the immobilized DNA write sequences in the masked (blocked) areas that were not exposed to the UV irradiation, and a second specific complementary DNA sequence can be hybridized to the immobilized DNA write sequences in the UV-irradiated area, in which the hydrogen bonding ability of thymine bases has been lost.

The DNA write sequence, the first complementary sequence, and/or the second complementary sequence can include one or more segments that (1) have been derivatized with different entities (e.g., fluorophores, chromophores, dyes, quantum dots, or nanoparticles, such as metallic or polymeric nanoparticles), carbon nanotubes (CNTs) and other nanocomponents, peptides, proteins (e.g., enzymes or antibodies), organic and/or biopolymers; and/or (2) have been derivatized with binding or crosslinking entities (e.g., amines, thiols, biotin, or psoralen). The first and/or second complementary sequences also can include an additional specific DNA sequence segment that is different than the original sequence(s). Such addition of new sequence specificity into the first and second complementary DNA sequences can allow four new DNA binding identities to be incorporated into the next (second) layer of the DNA material—two into the original (first) masked areas and two into the original (first) UV irradiated areas. The process can be repeated to incorporate new specific DNA binding identities for each new DNA layer, such that the second layer can have four new identities, the third layer can have eight new identities, the fourth layer can have 16 new identities, and so forth. This process can ultimately lead to production of highly pixelated DNA materials with a huge number of highly specific DNA sequence identities, which can range in pixel size, shape, and patterns from nanometers to centimeters.

Thus, a first aspect of this disclosure relates to the design of unique DNA constructs ("DNA write sequences") containing strategically placed thymine bases. A second aspect relates to hybridization methods that allow a substrate material onto which the specific DNA write sequences have been immobilized to produce, after masked patterning or write beam exposure to UV/Vis radiation, two unique or specific binding areas. Two different complementary DNA sequences can then be hybridized to each of the different binding areas—one specific DNA sequence complementary to the un-exposed areas, and a second specific DNA sequence complementary to the UV exposed areas. While UV inactivation (dimerization) of the thymine bases in the DNA write sequence is of key importance for the double write process, the design of the two complementary DNA sequences is equally important. Since the second complementary DNA sequences can potentially cross hybridize to the DNA write sequence in the un-exposed areas, the first complementary DNA sequence can be designed to prevent cross hybridization of the other sequence. This can be accomplished by designing the first complementary DNA sequence to have a slight overlap with the second complementary DNA sequence, which can produce a "displacer effect." Together with the use of controlled hybridization stringency, the displacer effect can allow the first and second complementary DNA sequences to hybridize much more selectively to the un-exposed areas and UV-exposed areas, respectively.

A second aspect of this disclosure relates to methods for producing homogeneous and heterogeneous two dimensional materials with macro-, micro-, and/or nanoscale features. Additional aspects of this disclosure relate to (a) methods, devices, and systems for carrying out more classical photolithography (masked) and for carrying out directed beam writing (un-masked), which includes but is not limited to DPP systems; (b) methods, devices, and systems for using electric field directed hybridization and self-assembly fabrication to produce homogeneous and complex heterogeneous three dimensional layered materials, structures, and devices; (c) the use of other physical, chemical, and biochemical methods and reagents to carry out subsequent modifications of DNA materials produced by the double write process; (d) applications and performance features for new materials, structures, and devices that can be fabricated based on the incorporation of highly specific binding identities in the photolithographic substrate material, as well as applications and performance features for new final materials, structures, and devices themselves that contain highly specific binding identities within their structures and/or on their surfaces.

Applications for the DNA constructs, methods, and processes provided herein include, without limitation, smart nanomorphing materials; batteries; photovoltaics; fuel cells; catalysts and synthetic enzyme structures; nano/micro integrated electronic and photonic devices; porous electrode/electrolyte/integrated sensor hydrogel materials, structures, and devices; cell and tissue engineering scaffolds, matrixes, and structures with integrated sensors; micro/nanoarray genotyping, sequencing, proteomic and drug discovery devices; lab-on-a-chip; and point of care, hand held, patch, and in vivo diagnostic devices.

As described herein, in some embodiments, a method as provided herein can include generating a first layer by (a) exposing DNA immobilized on a substrate to radiation using a first pattern mask or directed write beam, such that thymidine bases in the DNA in irradiated areas of the substrate will no longer hydrogen bond to complementary adenine bases, and (b) contacting the immobilized DNA in a first non-irradiated area of the substrate with a first complementary DNA sequence, and contacting immobilized DNA in a first irradiated (e.g., UV-irradiated) area of the substrate with a second complementary DNA sequence.

In some embodiments, the DNA can be immobilized on the substrate by covalent attachment. For example, in some embodiments, DNA can be immobilized on a substrate by covalent attachment through a homobifunctional crosslinker. Suitable substrates can contain, without limitation, silicon, glass, or plastic.

In some embodiments, the radiation can be ultraviolet radiation (e.g., ultraviolet radiation at a wavelength of 254 nm). The exposing step can include, for example, using a digital projection patterning system.

In some embodiments, the first complementary DNA sequence can have an extended sequence that overlaps with the second complementary sequence, which can produce a "displacer effect" that prevents cross hybridization.

In some embodiments, the first and/or second complementary DNA sequence can be derivatized. For example, the first and/or second complementary DNA sequence can be derivatized with one or more fluorophores, quantum dots, nanoparticles, nanocomponents, peptides, proteins, polymers, biopolymers, or binding or crosslinking entities (e.g., binding or crosslinking entities selected from amines, thiols, biotin, and psoralens).

In some embodiments, the first and/or second complementary DNA sequence can include additional DNA sequence beyond the complementary sequence, where the additional DNA sequence is not complementary to the immobilized DNA. See, e.g., FIGS. 10-13.

In some embodiments, the DNA write sequences can be derivatized with additional entities, such as, without limitation, fluorophores, chromophores, or nanoparticles.

In some embodiments, a method as provided herein can further include generating a second layer by (c) exposing the DNA immobilized on the substrate to radiation using a second pattern mask or directed write beam, such that thymidine bases in the DNA in irradiated areas of the substrate will no longer hydrogen bond to complementary adenine bases, and (d) contacting the immobilized DNA in the first irradiated area of the substrate with third and fourth complementary DNA sequences, and contacting immobilized DNA in the first non-irradiated area of the substrate with fifth and sixth complementary DNA sequences.

In some embodiments, a method as provided herein can further include generating a third layer by (e) exposing the DNA immobilized on the substrate to radiation using a third pattern mask or directed write beam, such that thymidine bases in the DNA in irradiated areas of the substrate will no longer hydrogen bond to complementary adenine bases, and (f) contacting the immobilized DNA in the first irradiated area of the substrate with seventh, eighth, ninth and tenth complementary DNA sequences, and contacting immobilized DNA in the first non-irradiated area of the substrate with eleventh, twelfth, thirteenth, and fourteenth complementary DNA sequences.

In some embodiments, a method as provided herein can include producing a heterogeneous two dimensional material with macroscale, microscale, or nanoscale features. In some embodiments, a method as provided herein can include producing a heterogeneous three dimensional layered material using electric field directed hybridization and self-assembly fabrication.

This document also features materials that can be used in DNA double-write/double binding identity methods as provided herein. The materials can include, for example, a photolithographic material comprising a solid substrate having DNA immobilized thereon, where the sequence of the DNA comprises thymidine bases at predetermined positions that allow the DNA to be used in a double-write method. In some embodiments, the DNA can be immobilized on the substrate by covalent attachment (e.g., via a homobifunctional crosslinker). Suitable materials for the substrate include, without limitation, silicon, glass, and plastic.

Previous attempts to use DNA for photolithographic nano/microfabrication have included application of DNA as a write material in which UV exposure causes complete loss of hybridization by a complementary DNA sequence to immobilized DNA in the UV exposed (un-masked) areas, while the complementary DNA sequence can still be hybridized to immobilized DNA in the masked or blocked areas that were not exposed to UV radiation (U.S. Pat. No. 6,652,808). This is considered to be a "single write" mechanism that produces one identity and leaves specific binding in the masked areas, but no DNA binding in the un-masked areas and consequently no further ability to use DNA self-assembly in the un-masked areas. In contrast, the methods provided herein involve a DNA double write/double identity process that leaves a specific DNA binding identity in the un-masked areas after UV irradiation, as well as another specific DNA binding identity in the masked or blocked areas. The advantages of these methods can include at least the following: (1) new structures can be self-assembled in both the masked and un-masked areas; (2) new specific DNA binding identities can be created in both the masked and un-masked areas; (3) an increasingly larger number of smaller pixelated features and/or DNA identities can be created as each new DNA layer is deposited; (4) highly complex integrated heterogeneous 2D and 3D materials, structures, and devices can be created; (5) the processes can be used with both classical photolithography and directed write beam/digital projection lithography; and (6) the processes combine the best aspects of top-down nano/micro photolithography with bottom-up directed DNA based self-assembly.

This document provides novel nucleic acids (e.g., DNAs, RNAs, and PNAs) in which thymine bases are strategically placed at specific locations, such that the nucleic acids can be used as double write/double identity photolithographic materials for applications such as macro, micro and nano-lithographic patterning, as well as for three dimensional nanofabrication. The specially designed nucleic acids typically are single stranded (ss) nucleic acid sequences that can range in size from 8 to 20,000 nucleotides or more (e.g., 10 to 1,000 nucleotides, 16 to 500 nucleotides, 20 to 100 nucleotides, or 25 to 50 nucleotides). Sequences having a length between 20 and 100 nucleotides can be particularly useful. By way of example, in some embodiments, a ss-DNA write sequence can be an oligonucleotide that is about 20 to about 50 (e.g., about 35) nucleotides in length, and that contains from 5' to 3' a run of about 10 to about 25 (e.g., about 17) deoxythymidylate nucleotides, followed by a selected sequence with a mix of deoxyadenylate, deoxyquanylate, and deoxycytidylate nucleotides. In some embodiments, an oligonucleotide DNA write sequence can be derivatized (functionalized) on the 5' terminal position with a primary amine linker group that will allow it to be attached (e.g., bound or immobilized) to a suitable substrate material.

In general, the thymine base section of a DNA write sequence, which will be sensitive to UV, can contain a minimum of at least 10% to 20% (e.g., at least 10%, at least 20%, at least 30%, at least 40%, at least 50%, at least 60%, at least 70%, at least 80%, at least 90%, 10% to 100%, 20% to 100%, 50% to 100%, or 100%) thymine bases in groups of two or more that are scattered within the sequence section. Distribution throughout the UV sensitive section of the DNA write sequence will prevent hybridization of the specific complementary DNA sequence after UV irradiation. In some embodiments, the UV sensitive section of a DNA write sequence can be completely composed of thymine bases, but addition of other bases (adenine, guanine and cytosine) can allow this section of the DNA write sequence to have more hybridization specificity, and also can help in optimizing the melting temperature (Tm).

The other specific section of a DNA write sequence typically does not contain thymine bases, but rather can be composed of any sequence of adenine, guanine, and cytosine bases to optimize the hybridization specificity and Tm for that section of the DNA write sequence. It is possible, however, to incorporate a small number of thymine bases (e.g., less than 10%, less than 7%, or less than 5% of the bases in the section) that are not in pairs. If strategically placed, the inclusion of thymine bases in this section of the DNA write sequence can still allow for hybridization of the specific complementary DNA sequence after UV irradiation.

The specific complementary DNA sequences (probes) can be ss-DNA sequences that are designed to be complementary to the two specific segments of the DNA write sequence—the first section containing thymine bases that is sensitive to UV irradiation, and the second section without thymine bases (or with only a small percentage of thymine bases) that is not sensitive to UV irradiation. These sequences can be completely complementary to the DNA write sequence, or contain enough complementarity to allow the sequence to hybridize at a certain Tm or other particular hybridization stringency conditions.

One of the complementary DNA sequences also can be designed to contain a segment that overlaps with other the complementary DNA sequence, which can produce a "displacer effect" that prevents cross hybridization of the complementary sequences. The overlap segment can have a length of about two to about 50 (e.g., about three to about 30, or about four to about 20) nucleotides. The complementary DNA sequences also can have an additional base sequence that extends in either the 3' or 5' direction, or additional base sequences extending in both the 5' and 3' directions, where the additional sequence(s) do not hybridize to any sections of the DNA write sequence. These additional sections also can be in double-stranded form. The addition of new sequence specificity into the first and second complementary DNA sequences allows four new DNA binding identities to be incorporated into the next (second) layer of the DNA material—two into the original (first) masked areas and two into the original (first) irradiated areas. The process can be repeated to incorporate new specific DNA binding identities for each new DNA layer, such that the second layer incorporates four new identities, the third layer incorporates eight new identities, the fourth layer incorporates 16 new identities, etc. By way of example, a 20 layer process can produce a million 100 nm$^2$ DNA pixels within a 100 um$^2$ area of DNA substrate material. Each pixel can have a loading of up to 500 DNA molecules encoded with a highly specific binding identity for that individual pixel. Current photolithographic processes are now able to produce a pixel size of less than 20 nm, and masked patterning allows an unlimited variety of two dimensional (X-Y) features and shapes to be created that can range from nanometers to centimeters. DPP systems can allow for creation of three dimensional (X-Y-Z) features and shapes, and especially expands the fabrication potential in the Z-dimension.

The specific design of the DNA write sequence (particularly the segments that are and are not sensitive to irradiation) and the specific complementary DNA sequences with respect to their Tm is an important parameter that can be used to improve the efficiency and specificity of the double write process and subsequent DNA self-assembly via hybridization. The DNA write sequences can be designed to be attached to or immobilized on a substrate material that can include, without limitation, silicon (including silicon wafers), quartz, fused silica, glass, mica, metal, and a variety of plastic substrate materials. The DNA write sequences can be attached covalently to the substrate material via, for example, incorporated amine, thiol, aldehyde or carboxyl groups at the 3' or 5' terminal position or via internal linker groups. DNA write sequences also can be non-covalently attached to or immobilized on support materials via biotin/streptavidin interactions, antibody/antigen interactions, or by aptamer binding. Techniques and methods for immobilizing or binding nucleic acid sequences to a wide variety of support materials are well known in the art. Nucleic acid sequences as provided herein also can be attached or immobilized within pre-formed porous 3D structures, such as (without limitation) PEG, agarose, polyacrylamide and other soft hydrogel type materials, as well as more solid materials, provided that they have transparency to UV irradiation (e.g., porous quartz, fused silica, or indium tin oxide (ITO)). The 3D substrates also must be porous enough to allow diffusion of the nucleic acid sequences into the substrate, and must be capable of binding the DNA write sequences. This can be accomplished by impregnating the substrate with a suitable binding agent (e.g., biotin/streptavidin), for example.

Using a UV photolithography (patterned mask) process and/or a directed write beam (mask-less) process, the substrate surface with the immobilized DNA write sequences can be exposed to radiation (UV and/or Vis), which can modify the thymine bases so that they no longer hydrogen bond to complementary adenine bases via Watson-Crick base pairing. The exposure time typically is dependent upon the UV wavelength and intensity, generally being in a window where dimerization of the thymine bases is complete, but where overexposure that might damage the other bases (adenine, guanine, cytosine, and uracil) in the sequences does not occur or is minimized. In general, adenine, guanine, cytosine, and uracil tend to be much less sensitive than thymine to UV irradiation. Thus, proper UV exposure times can be readily determined experimentally.

The unique design of the immobilized DNA write sequence, loss of thymine base hydrogen bonding upon exposure to UV irradiation, and controlled hybridization conditions that include, without limitation, temperature, pH, concentrations of counter ions such as $Na^+$, $K^+$, and $Mg^{++}$, and buffer makeup and concentration, allows for subsequent hybridization of the specially designed complementary nucleic acid sequences to be carried out. For example, a first specific complementary DNA sequence can be hybridized to the immobilized DNA write sequence in the masked area that was not UV irradiated, and a second specific complementary DNA sequence can be hybridized to the immobilized DNA write sequence in the un-masked area that was UV irradiated. Depending on the DNA sequence design (e.g., its base sequence, length, Tm, and derivatization with other entities), the specific complementary DNA sequences can be hybridized one at time or in some cases at the same time.

It is also within the scope of the methods provided herein to use DC electrophoretic (>1.2 volts), DC electrostatic (<1.2 volts), and/or AC dielectrophoretic (DEP) techniques and devices to apply electric fields that can concentrate nucleic acids and accelerate their hybridization and provide stringency for improved hybridization specificity, and also to use reverse electric fields to promote dehybridization of nucleic acid sequences. In addition, physical, chemical and biochemical (e.g., enzymatic) methods and reagents can be used for de-hybridization. The nucleic acid sequences and constructs provided herein also can be modified using, without limitation, DNases, RNases, ligases, polymerases, terminal transferases, and DNA amplification techniques such as polymerase chain reaction (PCR). Further, the DNA write sequence and the first, second, and/or subsequent (where applicable) complementary sequences (also referred to as complementary DNA probe sequences) can include nucleic acid sequences that have been: (1) derivatized with entities such as, without limitation, fluorophores, chromophores, electrochemical moieties, dyes, quantum dots, nanoparticles (e.g., metallic or polymeric nanoparticles), CNTs and other nanostructures and nanocomponents, peptides, proteins (e.g., enzymes and antibodies), apatamers, dendrimers, organic polymers, and biopolymers; and/or (2) derivatized with binding or crosslinking entities that can include without limitation, amines, thiols, aldehydes, carboxyl groups, biotin, streptavidin, psoralen, and cinnamate; and/or (3) modified to include additional specific DNA sequences. These can include single-stranded and/or double-stranded sequences that can provide spacing, superstructure and structural stability, and/or functionality (e.g., photonic, electrical, electronic, mechanical, or catalytic function), as well as more three dimensional DNA structures (e.g., loops or crosses) produced using DNA origami techniques or using RNA 3D constructs, for example.

Figure 4:
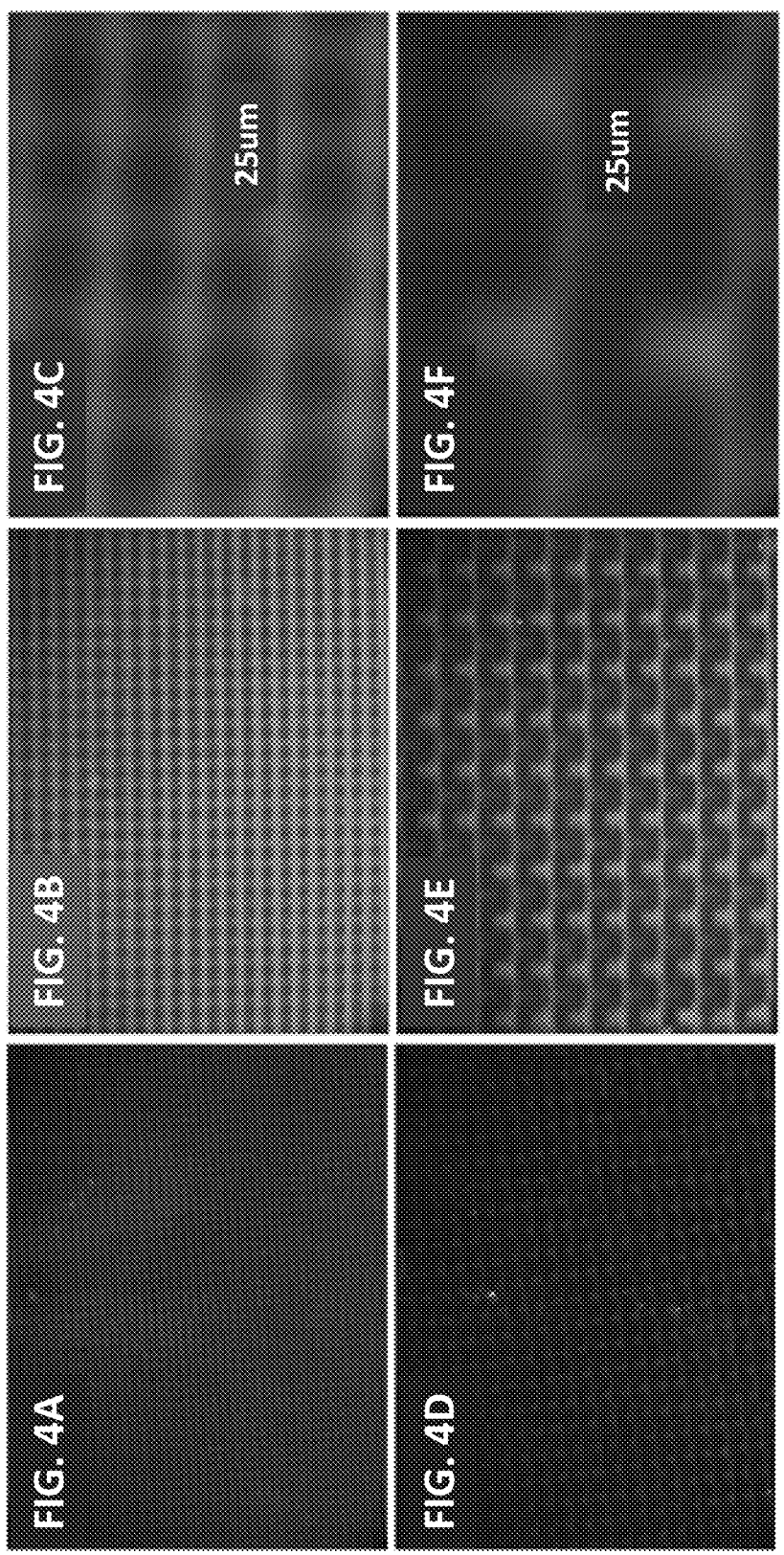
FIGS. 4a-4f are a series of fluorescent images showing DNA single write patterning, where electrostatic bonding was used to immobilize the initial DNA write sequence to a glass substrate. UV irradiation at 254 nm, at 4 mW/cm$^2$ for 30 minutes through a Cr quartz patterned mask was carried out on the DNA write sequence A (SEQ ID NO:1) that was electrostatically attached to the amino modified glass surface. The first complementary probe sequence (B; SEQ ID NO:2), an A24-mer oligonucleotide labeled with the Cy3 fluorophore, was then hybridized.
Figure 5:
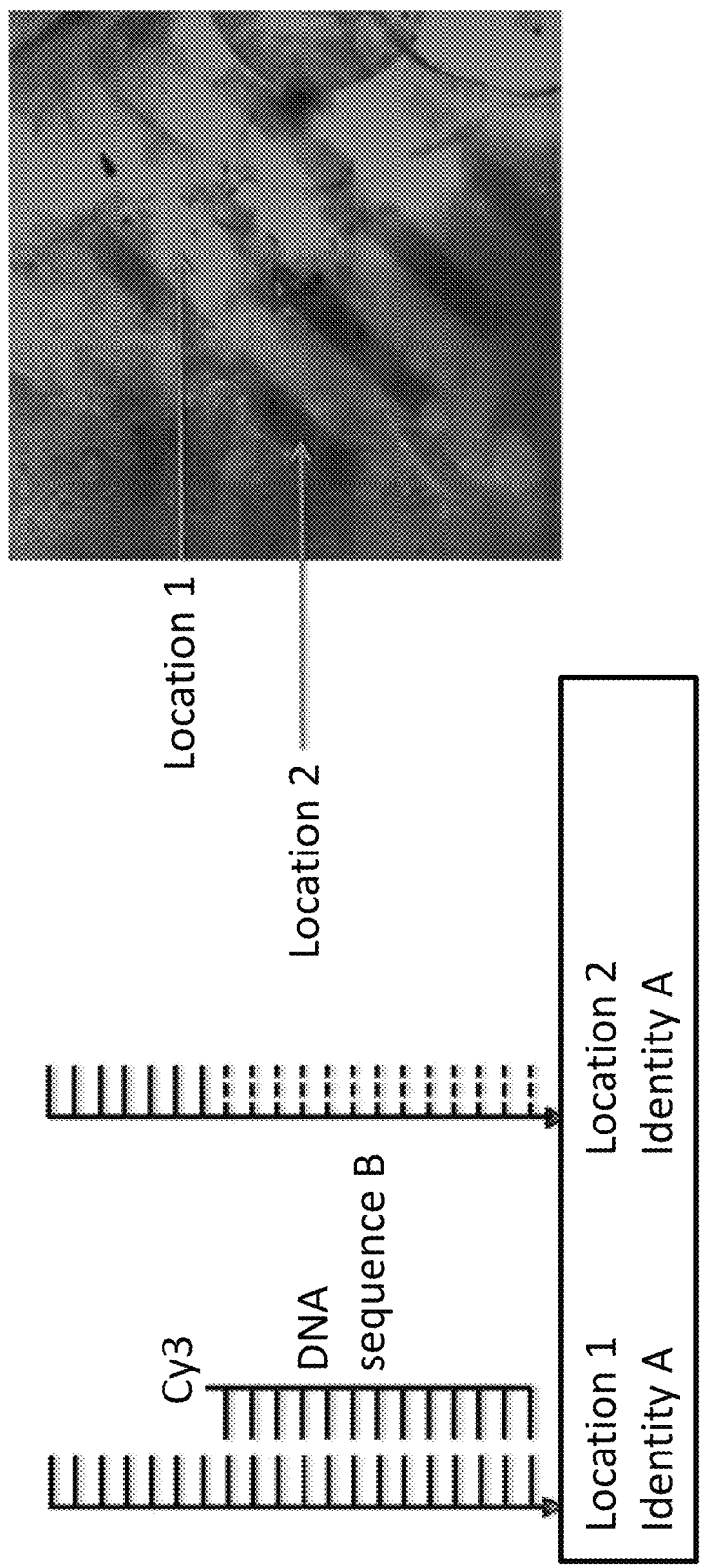
FIG. 5 shows DNA single write results when using a digital projection patterning (DPP) system for mask-less UV writing to the DNA substrate material.
Figure 6:
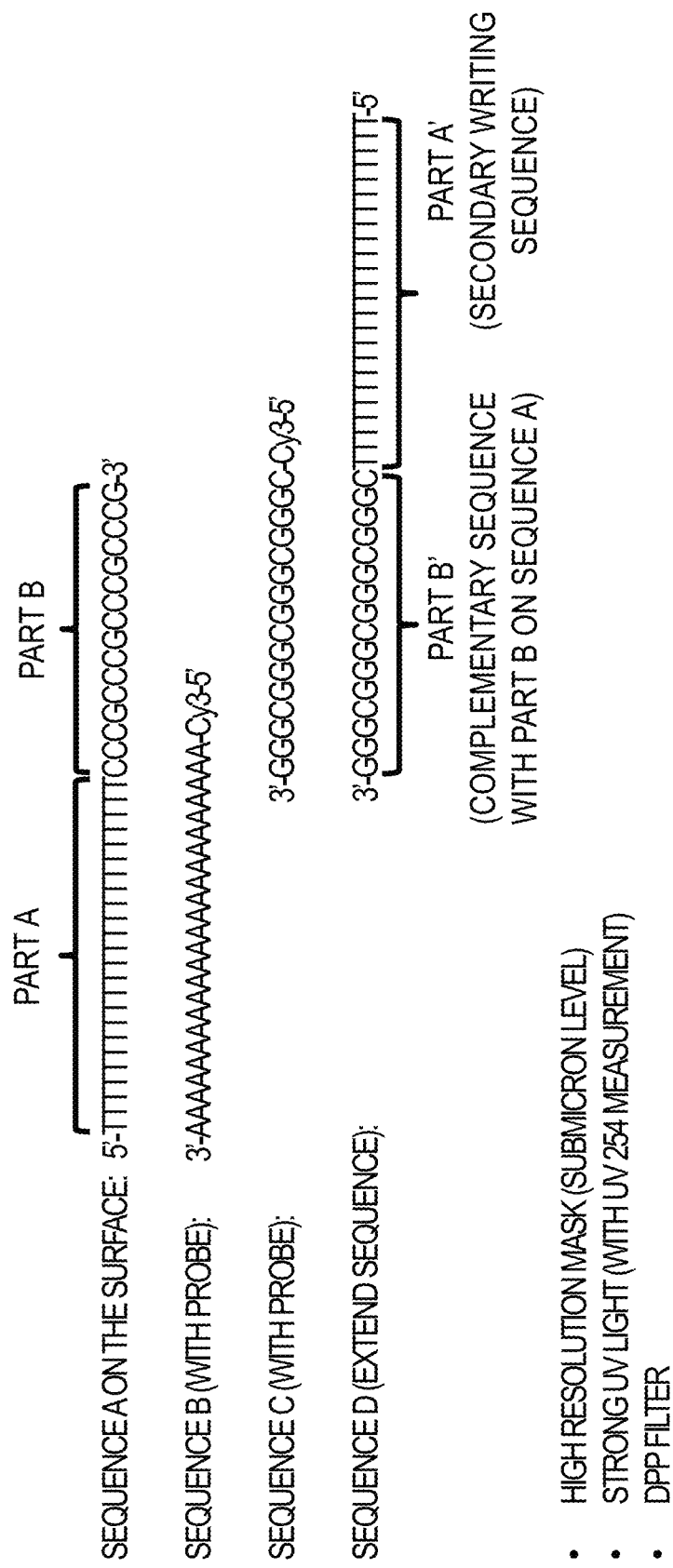
FIG. 6 shows DNA sequences that can be used for building five new DNA identities from the original first single stranded (ss) DNA write sequence A (SEQ ID NO:1), after UV patterning and hybridization of complementary DNA probe sequences B (SEQ ID NO:2), C (SEQ ID NO:3) and D (SEQ ID NO:4). Sequence D is an extended complementary DNA probe sequence that also contains a new write sequence.
Figure 7:
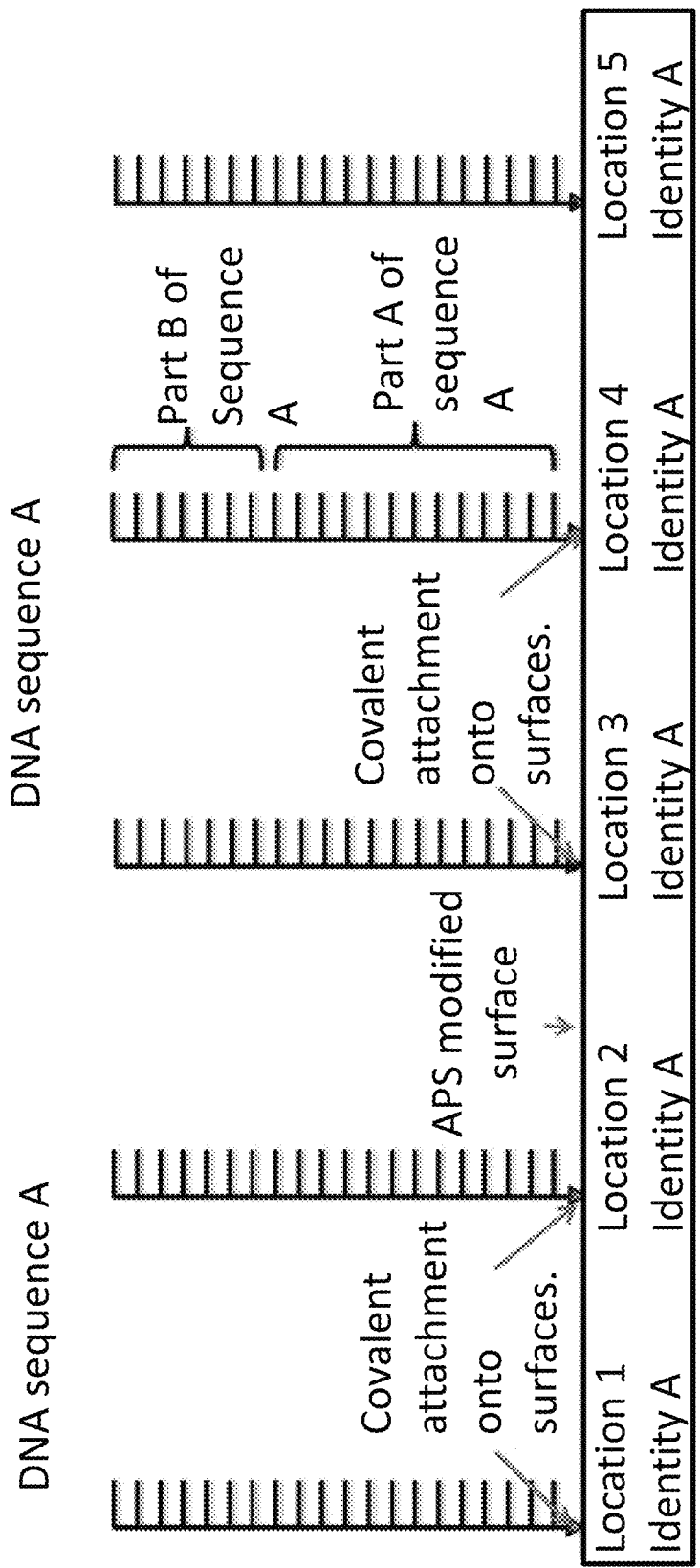
FIG. 7 shows the first step in a process for using ss-DNA write sequence A to produce five different identities after UV masking and hybridization with different complementary probe sequences (B, C, and D). In step 1, ss-DNA write sequence A with sequence A and B identities is bound covalently onto the substrate surface.
Figure 8:
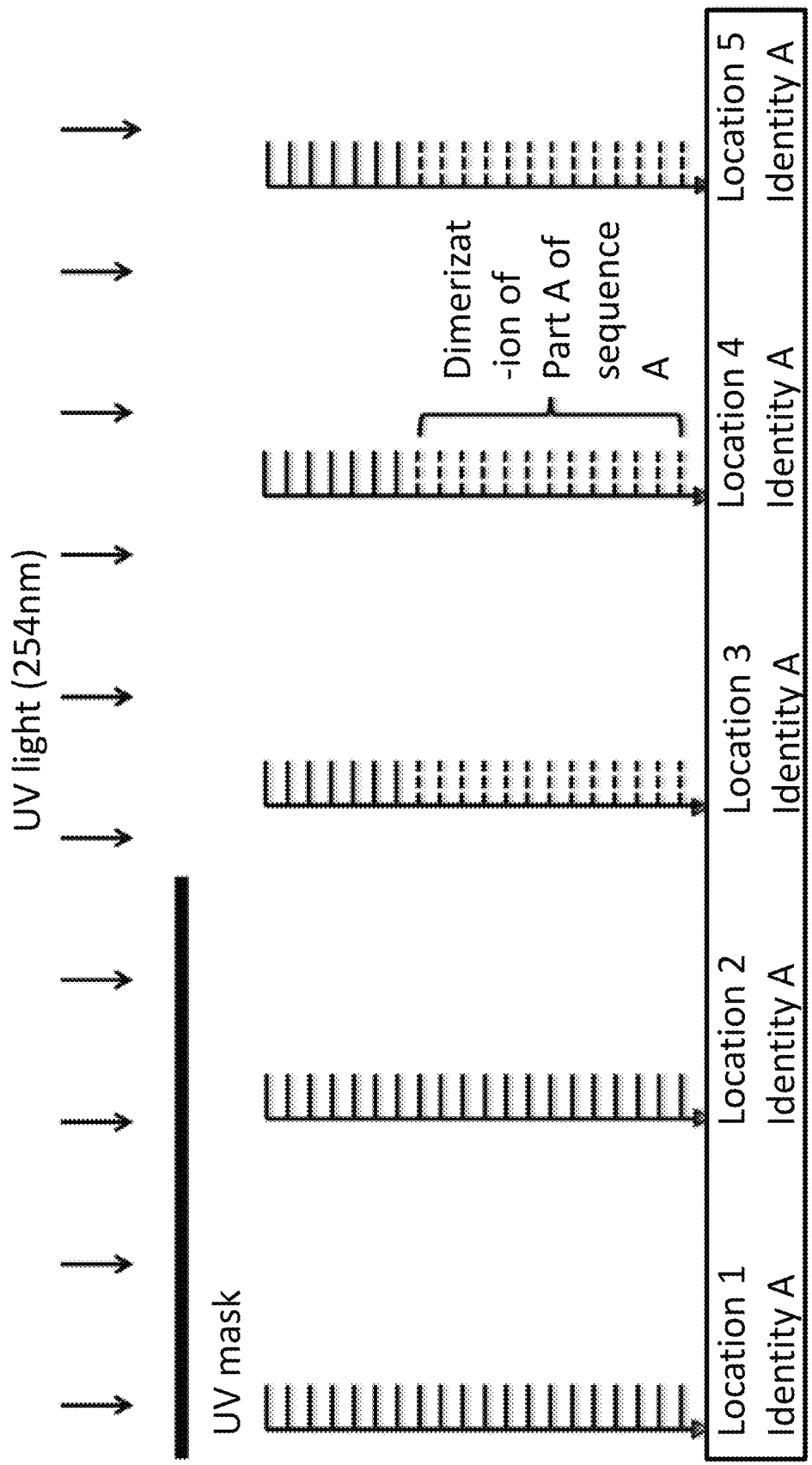
FIG. 8 shows the second step in a process for using ss-DNA write sequence A to produce five different identities. In step 2, section A on DNA write sequence A is dimerized and/or damaged by UV irradiation (254 nm), such that it is not able to hybridize to complementary DNA probe sequence B.
Figure 9:
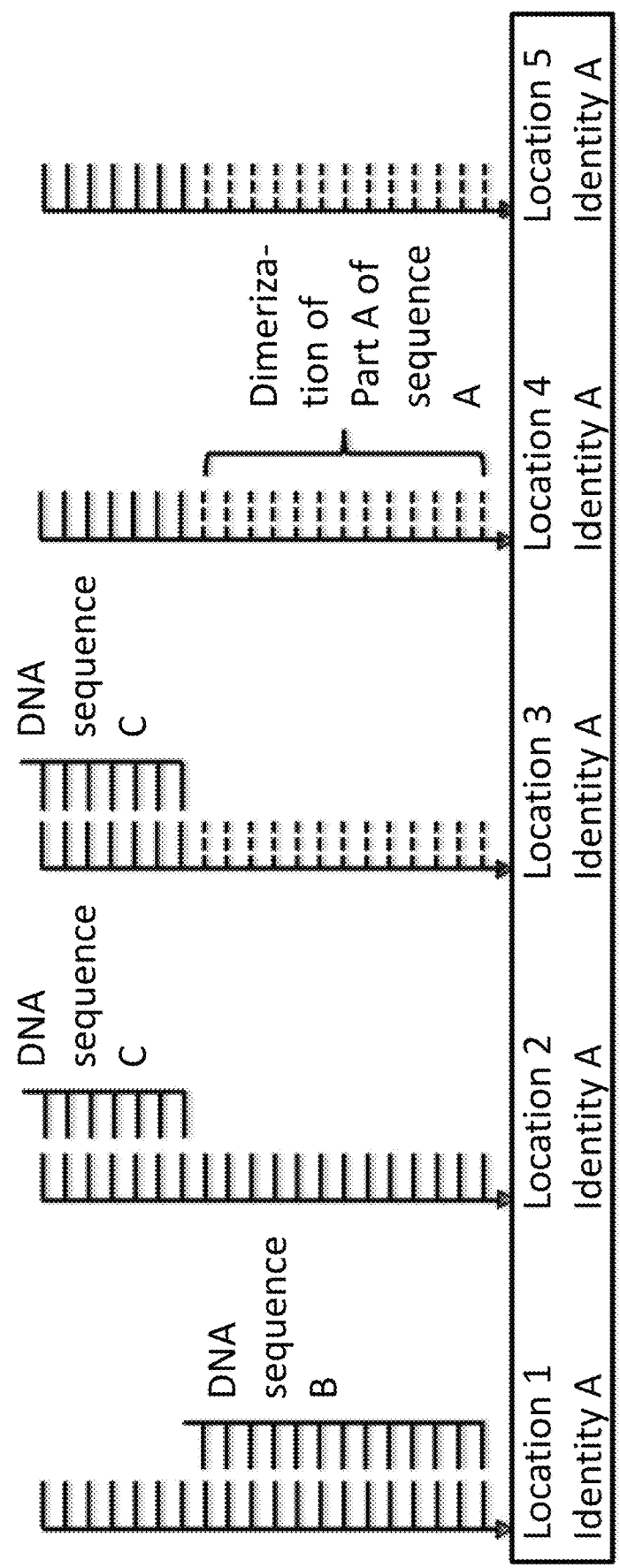
FIG. 9 shows the third step in a process for using ss-DNA write sequence A to producing five different identities. In step 3, hybridization of the complementary probe sequences (B and C) to the DNA write sequence is carried out.
Figure 10:
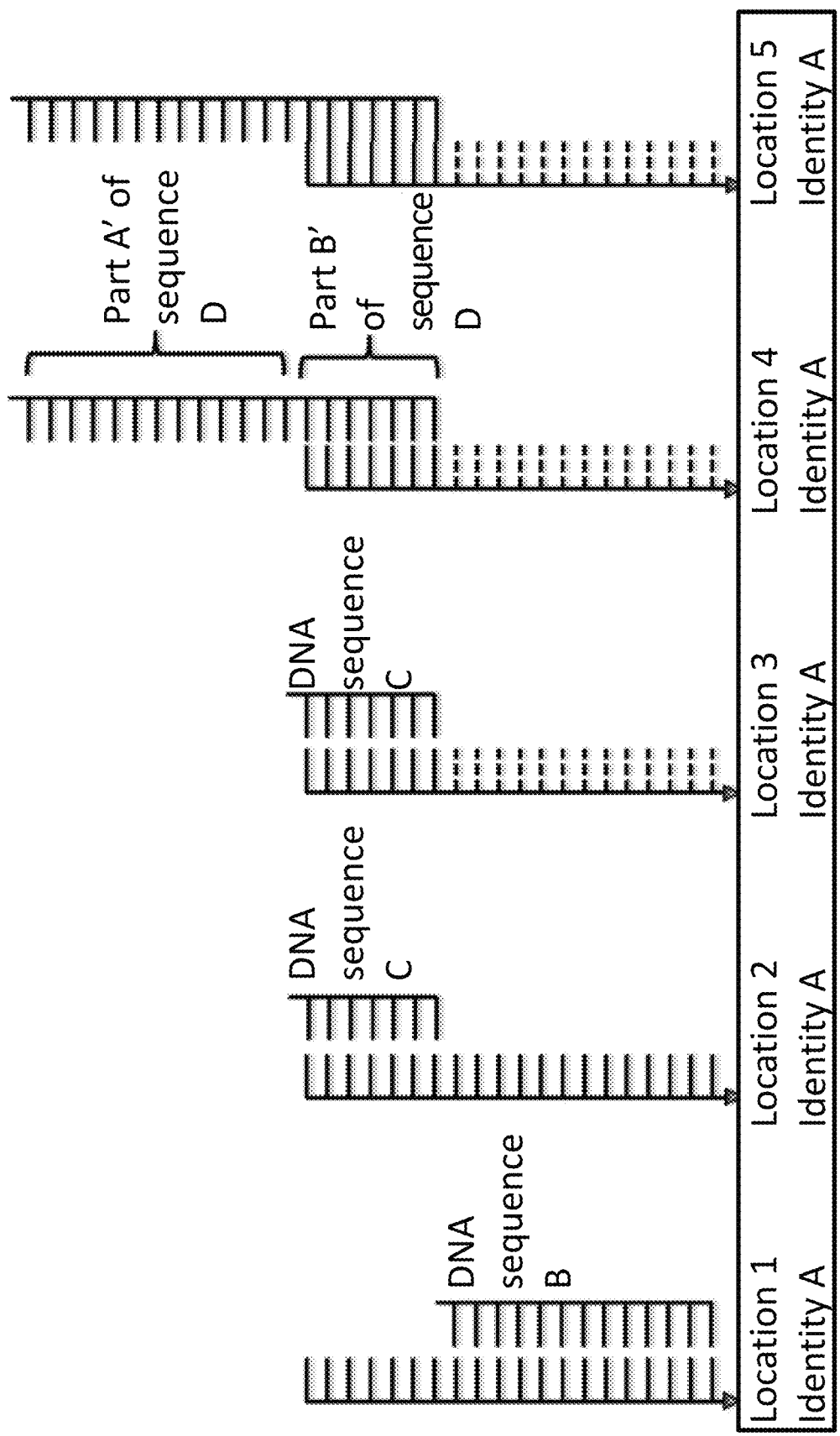
FIG. 10 shows the fourth step in a process for using ss-DNA write sequence A to produce five different identities. In step 4, a new complementary DNA probe sequence D, with a new extended write sequence, is hybridized.
Figure 11:
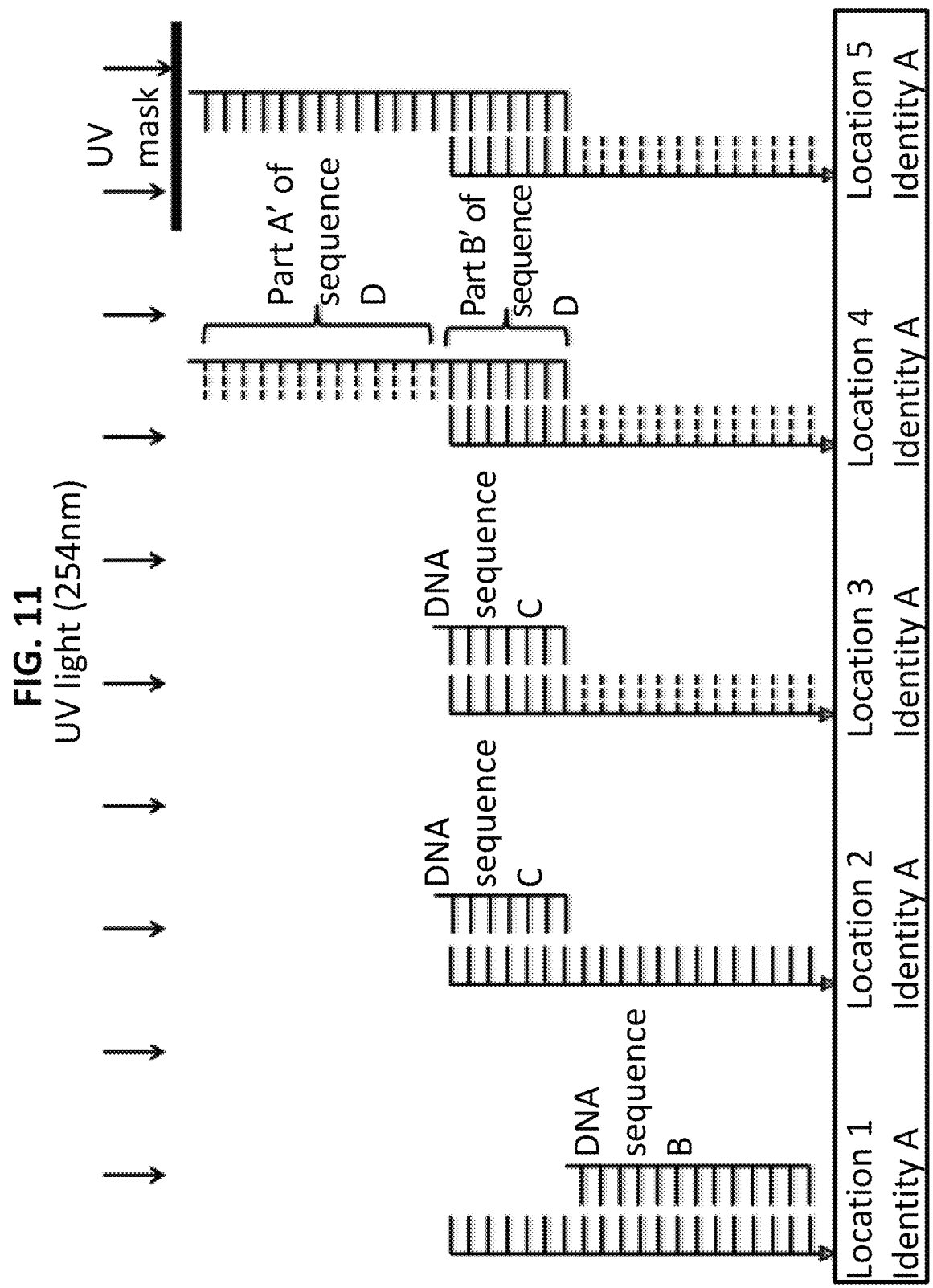
FIG. 11 shows the fifth step in a process for using ss-DNA write sequence A to produce five different identities. In step 5, the identity section (A') on sequence D is dimerized/damaged by a second exposure to UV light (254 nm).
Figure 12:
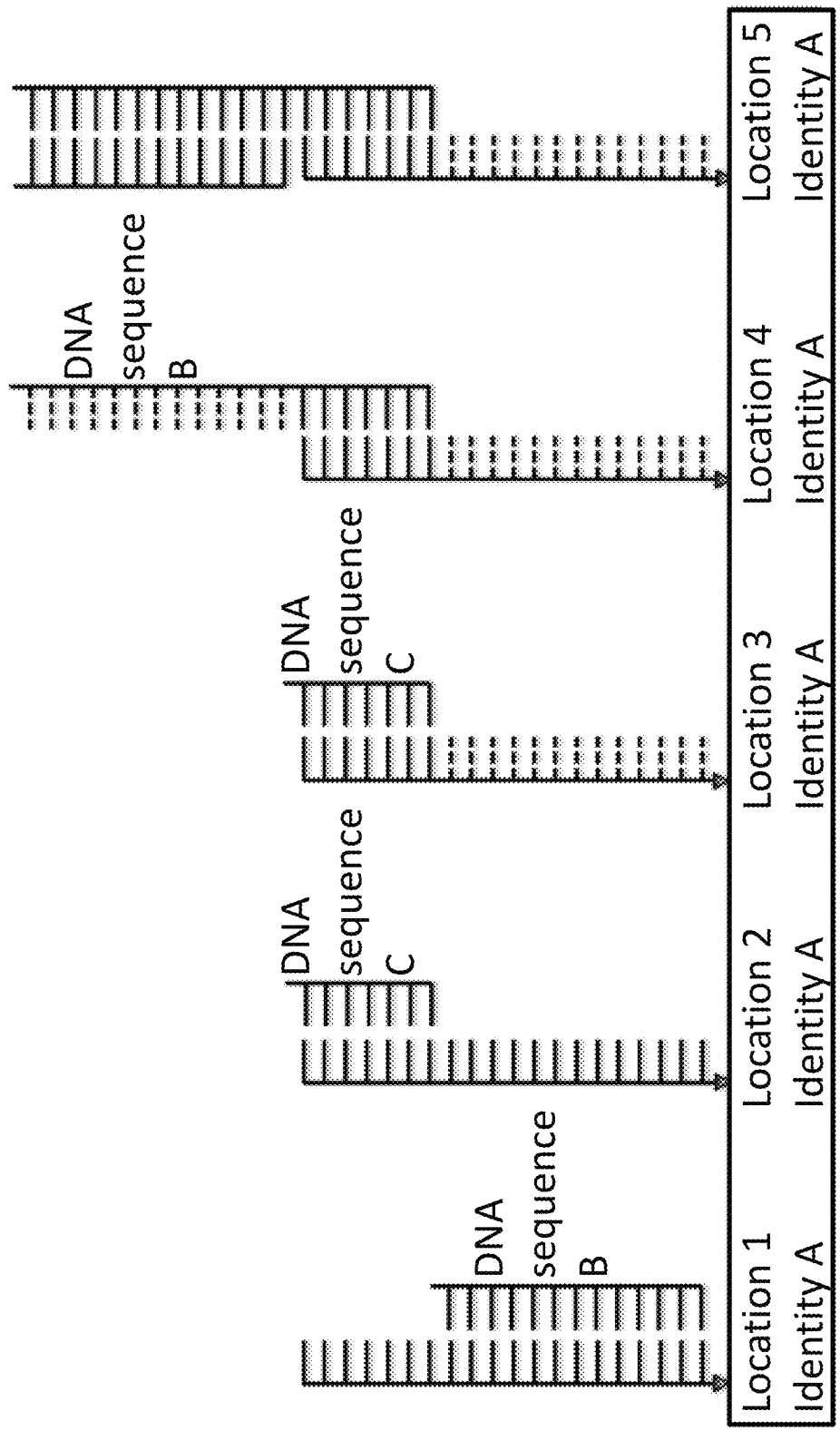
FIG. 12 shows the sixth step in a process for using ss-DNA write sequence A to produce five different identities. Step 6 includes hybridization of complementary probe sequence B to DNA write sequence D, and specifically to the secondary write sequence that was not irradiated by UV (location 4).
Figure 14A:
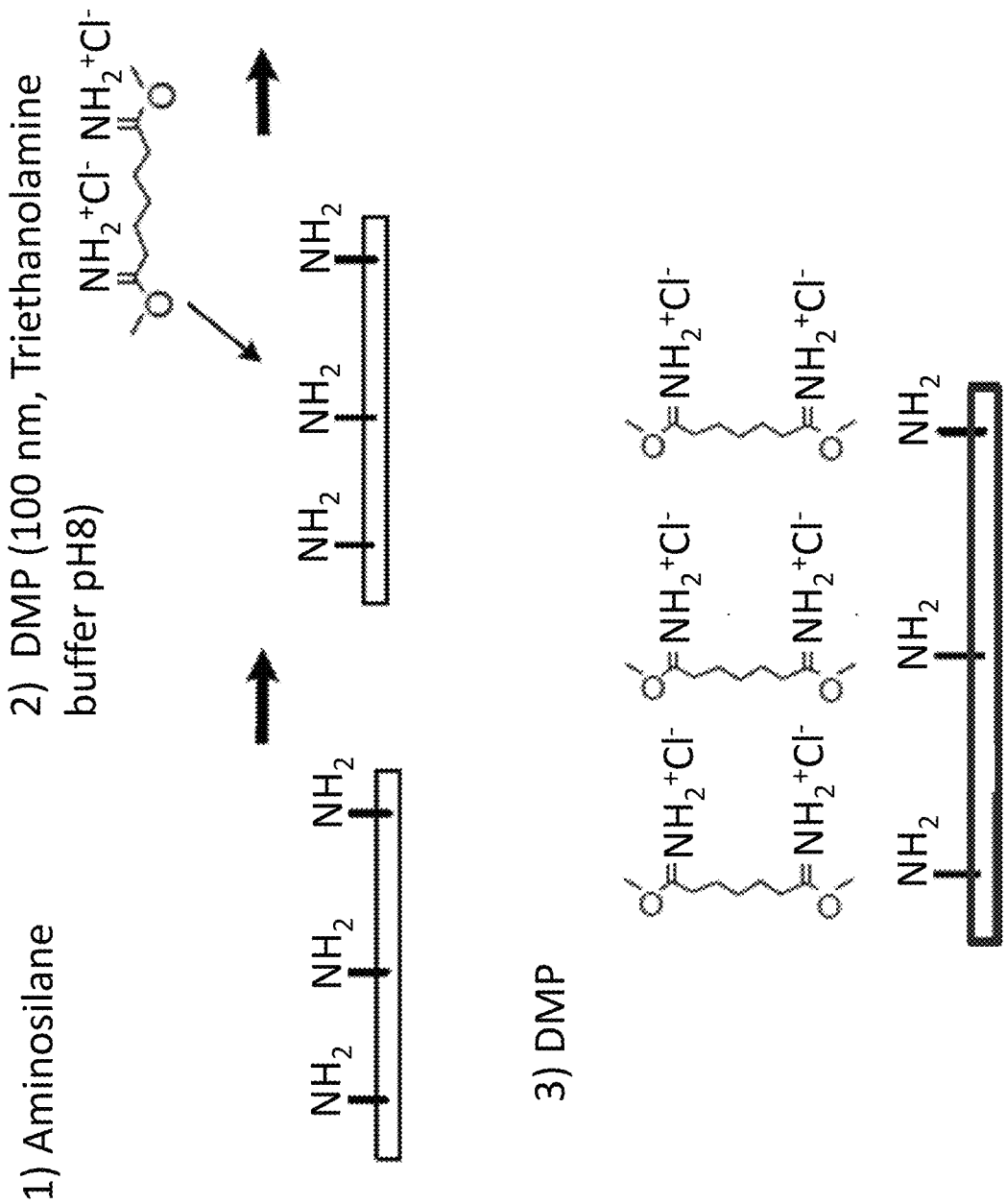
FIGS. 14A and 14B show steps in a procedure for using the homobifunctional crosslinking reagent dimethyl pimelimidate (DMP) to covalently bond an amino-derivatized first DNA write sequence onto a glass surface treated with aminosilane reagent.
Figure 14B:
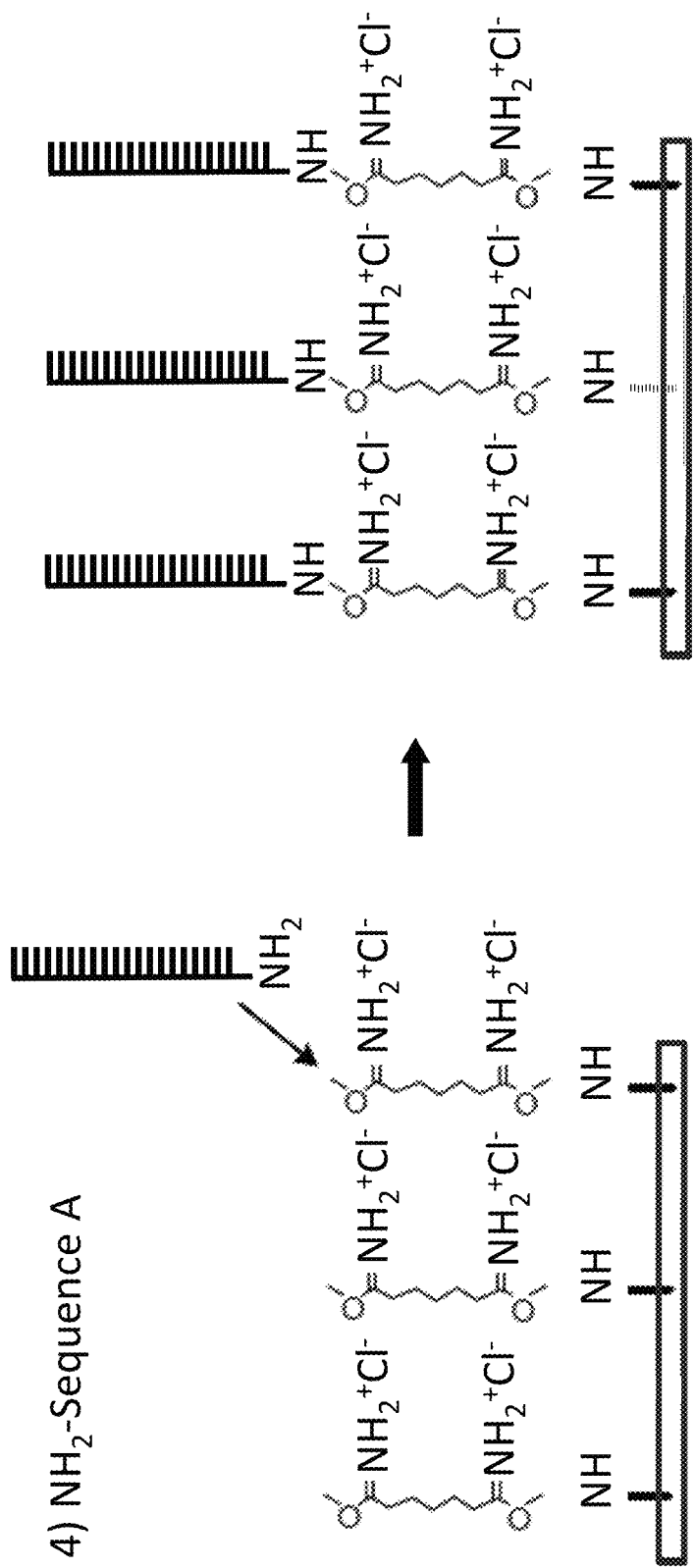

FIGS. 1-14 show the basic concepts and some first order DNA write and complementary sequence constructs as provided herein. In particular, FIGS. 1-3 show the basic DNA double write procedure using UV patterning with a mask, and initial results showing first level reduction to practice. FIG. 4 shows single write results for a first DNA write sequence immobilized electrostatically onto an amino derivatized glass substrate. FIG. 5 shows DNA single write results obtained using a DPP system for mask-less patterning. FIGS. 6-12 show steps in a scheme for building five new DNA identities from a first original single stranded (ss) DNA write sequence (A), after UV patterning and hybridization of complementary DNA probe sequences (B, C, and D), where sequence D is an extended complementary DNA probe sequence that also contains a new write sequence. FIG. 13 shows a scheme for the design of complementary DNA probe sequences labelled with a Cy3 fluorophore, a 200 nm red fluorescent nanoparticle, a 200 nm yellow fluorescent nanoparticle, and a 40 nm gold nanoparticle, as well as a complementary DNA probe sequence D with an extended DNA write sequence. FIGS. 14A and 14B show an example of a procedure for using the homobifunctional crosslinking reagent dimethyl pimelimidate (DMP) to covalently bond (immobilize) an amino derivatized first DNA write sequence onto an aminosilane treated glass surface.

A critical aspect of the methods provided herein is the design of unique DNA sequence constructs, and the hybridization methods that allow a substrate material with immobilized DNA write sequences to produce, after masked patterning or write beam exposure to UV/Vis radiation, two unique or specific binding areas to which two different complementary DNA sequences can be hybridized. While UV inactivation of the strategically placed thymine bases in the write sequence is of key importance for the double write process, the design of the complementary DNA probe sequences is another equally important aspect. Unique sequence design is important, as one of the complementary DNA probe sequences could potentially still cross-hybridize to the DNA write sequence in areas that were not exposed to UV irradiation.

In order to produce more specific and efficient hybridization of the two complementary DNA probe sequences, one of sequences can be designed to prevent cross-hybridization of the other sequence to the immobilized DNA write sequence in the blocked or unexposed areas. This can be accomplished using a novel design feature in which one of the complementary DNA probe sequences includes a segment that overlaps with the other complementary probe sequence. This sequence overlap can range from two to 50 nucleotides in length, depending on the overall size of the specific DNA sequences to be hybridized. An overlap of about three to about 30 nucleotides, or about four to about 20 nucleotides, can be particularly useful. The sequence overlap can produce a "displacer effect," which together with optimal design of the each probe's Tm and use of controlled hybridization stringency (Tm) conditions, can allow the different complementary DNA probe sequences to hybridize much more efficiently to their specific targets in the DNA write sequence within the UV exposed and unexposed areas.

In some embodiments, an overlap sequence generally can be included in the specific DNA complementary probe sequence that is designed to hybridize to the thymine-containing section of the DNA write sequence, and ultimately to hybridize to the areas that are not exposed to UV irradiation. The displacer effect of this complementary probe sequence can prevent the second complementary probe sequence from cross-hybridizing to the DNA write sequences in the areas that are not UV irradiated. By designing complementary DNA probe sequences with overlap sequences optimized to produce the displacer probe effect and with optimized Tms, the overall efficiency and selectivity for hybridization of the complementary DNA probes can be greatly improved, significantly limiting any cross-hybridization between the two probes to the DNA write sequence in the un-exposed and UV exposed areas.

FIG. 15 shows one example of a DNA write sequence (FWS: ID-1&ID-2; SEQ ID NO:1) and two complementary DNA probe sequences ID-1-RF-CP (SEQ ID NO:5) and ID2-GF-CP (SEQ ID NO:3), where the ID-1-RF-CP sequence incorporates a six nucleotide displacer sequence (GGG-CGG). The ID-1-RF-CP probe sequence hybridizes to the ID-1 section of the FWS: ID-1&ID-2 write probe and prevents, by the displacer effect, hybridization of the ID-2-GF-CP probe sequence to the ID-2 region of the FWS: ID-1 &ID-2 write probe sequences in the blocked or masked areas that were not exposed to UV radiation.

The invention will be further described in the following examples, which do not limit the scope of the invention described in the claims.

EXAMPLES

Example 1—Materials and Methods

Preparation of DNA Sequences:

All sequences were ordered from Integrated DNA Technologies, Inc. (Coralville, Iowa). The sequence of immobilized ssDNA, FWS: ID-1&ID-2, on the substrate was $NH_2$—C6-5'-TTTTTTTTTTTTTTTTTTTTTTTC-CCGCC CGCCCGCCCG-3' (SEQ ID NO:1). The sequences used for the double write (ID-1-RF-CP, ID-2-GF-CP) were 5'-Alexa Fluor 546 (ex 555, em 571)-GGGCGGGAAAAAAAA AA-3' (SEQ ID NO:10) and 5'-Alexa Fluor 488 (ex 492, em 517)-GGGCGGGCGGGC GGGC-3' (SEQ ID NO:11). For the double write with second level write, the first red fluorescent complementary probe sequence for the single level write probe was 5'-Alexa Fluor 546 (ex 555, em 571)-AAAAAAAAAAAAAAAAAAAAAAAA-3' (SEQ ID NO:2). The SWS: ID-1&ID-3 sequence was 5'-TTTTTTTTTTTTTTTTTTTTTTTT GGGCGGGCGGGCGGGC-3' (SEQ ID NO:7). The sequence of the second green fluorescent complementary probe was 5'-Alexa Fluor 488 (ex 492, em 517)-AAAAAAAAAAAAAAAAAAAAAAAA-3' (SEQ ID NO:2). The sequence used for the biotinylated probe was 5'-biotin-AAAAAAAAAAAAAAAAAAAAAAAA-3' (SEQ ID NO:2). The sequence for the SSP: ID-4&ID-5 was 5'-AAAAAAAAAAAA AAAAAAAAAAACAGGACA-GACAGG-3' (SEQ ID NO:9). The sequence for the far red fluorescent complementary probe to detect ID-5 was 5'-Alexa Fluor 647 (ex650, em670)-CCTGTCTGTCCTG-3' (SEQ ID NO:8).

Preparing the ss-DNA Strand for Immobilization onto the Substrate:

Covalently bonded ssDNA functional glass slides were prepared in two steps using amine ($NH_2$) activated glass slides. First, 100 mM of disuccinimidyl suberate (DSS), a homofunctional amine-to-amine crosslinker, was dispersed in dimethyl sulfoxide (DMSO) and applied to the amine activated glass slide. The mixture was reacted for 1 hour at room temperature. The glass slides were then washed twice with DMSO and DI water, and dried with Nitrogen ($N_2$) gas. Twenty μM $NH_2$-ssDNA strands ($NH_2$—C6-5'-TTTTTTTTTTTTTTTTTTTTTTTCCCGCCCGCCCGC-CCG-3'; SEQ ID NO:1) in 1×SSC buffer were applied and reacted for 1 hour, after which the glass slides were washed twice with 1×SSC buffer and dried with $N_2$ gas.

Patterning by 2D UV Photolithography:

The power of a 254 nm UVC hand lamp (UVP, LLC) was measured at a working distance of 2 cm with a 254 nm peak photodiode (Newport Corporation). The 254 nm UV wavelength power was calculated to be 3 mW/cm$^2$. A lab bench precision 2D UV photolithography system that handles 4-inch silicon was used. The ss-DNA strand substrate was vacuum-contacted with a custom-designed chrome mask purchased from Phototronics, Inc. (Seattle, Wash.) and aligned using the MA-6 mask aligner. The substrate was exposed to UV light through the photomask for 5 minutes.

Double Write Hybridization:

After the ss-DNA-immobilized substrate was patterned by UV exposure, 20 μl of the first writing solution (20 μM), 5'-Alexa Fluor 546 (ex 555, em 571)-GGGCGGGAAAAAAAAAA-3' (SEQ ID NO:10) in 1×SSC was placed on the substrate and covered with a cover slip. After hybridizing with the substrate for 1 hour at room temperature, the substrate was washed with 1×SSC buffer using a 250 ml water bath at room temperature for 1 minute. The washing step was repeated, and the substrate was dried with $N_2$ gas. To complete the double write, 20 μl of the second writing solution (20 μM), 5'-Alexa Fluor 488 (ex492, em517)-GGGCGG GCGGGCGGGC-3' (SEQ ID NO:11) was placed on the substrate and covered with a cover slip. After hybridizing the substrate for 1 hour at room temperature, the double write substrate was washed twice with 1×SSC buffer and dried with $N_2$ gas.

Double Write with Second Level Write Hybridization:

After the FWS conjugated substrate was patterned by UV exposure, 20 μl of 20 μM first level writing red fluorescent complementary probe in 1×SSC was left to hybridize on the substrate for 1 hour at room temperature. The substrate was then washed twice with 1×SSC buffer and dried with $N_2$ gas. This process was repeated under the same conditions for the SWS solution, biotinylated probe, third write sequence (TWS): ID-4&ID-5, green fluorescent complementary probe, and far red fluorescent complementary probe to detect ID-5. Cy3-Streptavidin (Sigma-Aldrich, Inc.; St. Louis, Mo.) was attached onto a patterned biotinylated probe hybridized substrate and washed twice with 1×PBS.

Example 2—DNA Double Write Process

A basic procedure for carrying out DNA double write photolithography using DNA write sequences and complementary probe sequences is shown in FIG. 15, and initial write results are shown in FIG. 16. The first step in this more optimized process is immobilization of a specially designed first DNA writing sequence (FWS: ID-1&ID-2) having the sequence 5'-TTTTTTTTTTTTTTTTTTTTTTTCCCGC-CCGCCCGCCCG-3' (SEQ ID NO:1) on the glass substrate surface. This DNA sequence has two sections: ID-1 and ID-2, which after UV exposure, allow two different complementary probes, ID-1 red fluorescent complementary probe (ID-1-RF-CP, having the sequence 3'-AAAAAAAAAAGGGCGGG-Alex546-5'; SEQ ID NO:10) and ID-2 green fluorescent complementary probe (ID-2-GF-CP, having the sequence 3'-GGGCGGGCGGGCGGGC-Alex488-5'; SEQ ID NO:11) to be separately hybridized to the un-exposed and the UV exposed regions, respectively. This ability to produce two distinguishable identities for hybridizing different complementary probes is an important and unique attribute of the DNA double write process.

UV inactivation of the thymidine bases in the ID-1 area of the FWS: ID-1&ID-2 sequence also is of key importance for the double write process, but the design of the ID-2 sequence and the design of the ID-1-RF-CP and ID-2-GF-CP sequences are equally important for the process. Since the ID-2-GF-CP sequence hybridizes to the ID-2 sequence in both the UV exposed and un-exposed areas, the ID-1-RF-CP probe must be designed to prevent hybridization of the ID-2-GF-CP probe in the un-exposed areas. This can be accomplished by designing the ID-1-RF-CP probe so it is not only complementary to the ID-1 sequence of the FWS: ID-1&ID-2, but also has a short segment of sequence (GGGCGGG) that overlaps with a section of the ID-2 sequence. Additionally, the ID-1-RF-CP is a longer sequence than the ID-2-GF-CP probe, with a higher Tm and binding constant. The Tms for the ID-1-RF-CF and the ID-2-GF-CP complementary DNA probes when hybridized to the FWS: ID-1 & ID-2 DNA write sequence are shown in Table 1.

TABLE 1

| DNA Sequences | | Tm (° C.) | Hybridization/ Binding | UV Action |
|---|---|---|---|---|
| ID-1-RF-CP | FWS: ID-1&ID-2 | 48.8 | High | Write (1) |
| ID-1-RF-CP | FWS: ~~ID-1~~ &ID-2 | 30.2 | Low | Block |
| ID-2-GF-CP | FWS: ~~ID-1~~ &ID-2 | 73 | High | Write (2) |
| ID-2-GF-CP | FWS: ID-1&ID-2 with ID-1-RF-CP | 21-32 | Low | Block |

Figure 16A:
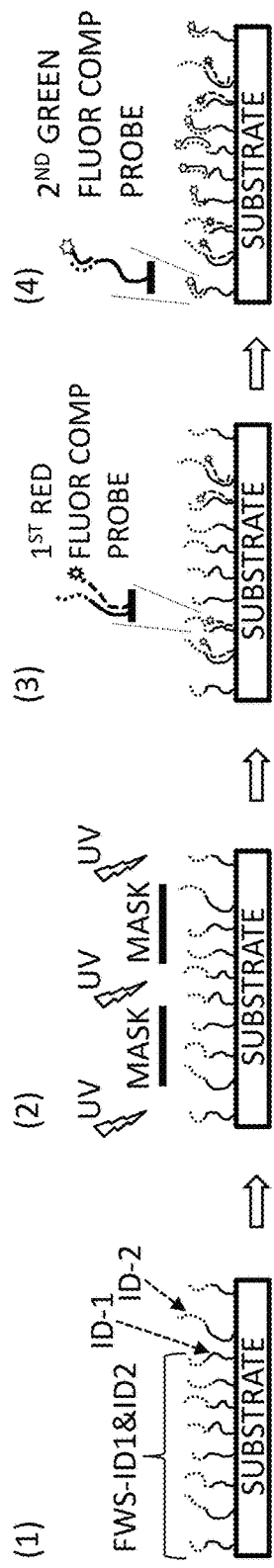
FIGS. 16a-h show a DNA double write UV photolithography scheme and initial results.
Figure 16B:
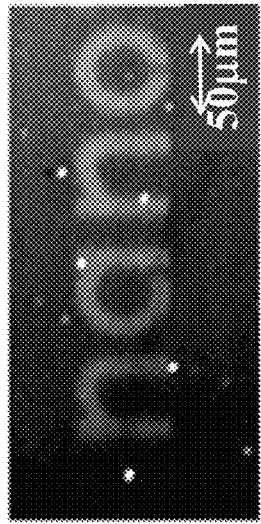
Figure 16C:
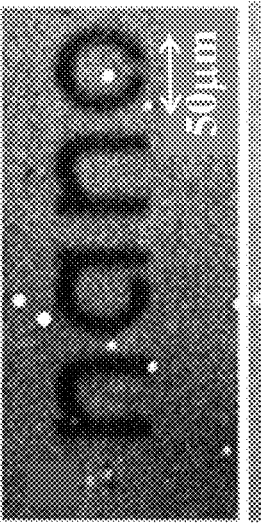
Figure 16D:
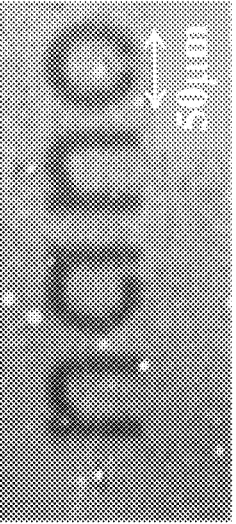
Figure 16G:
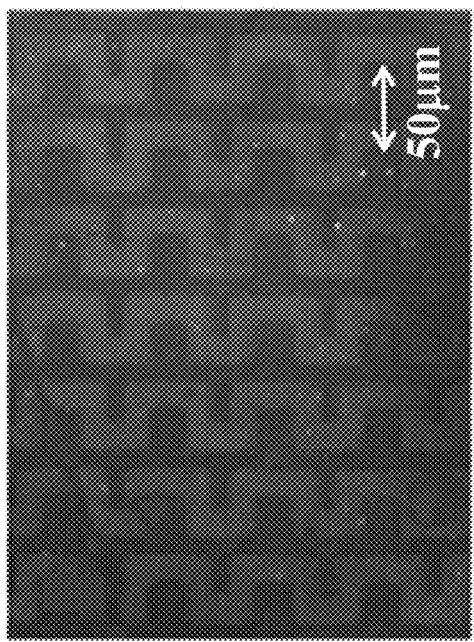
Figure 16H:
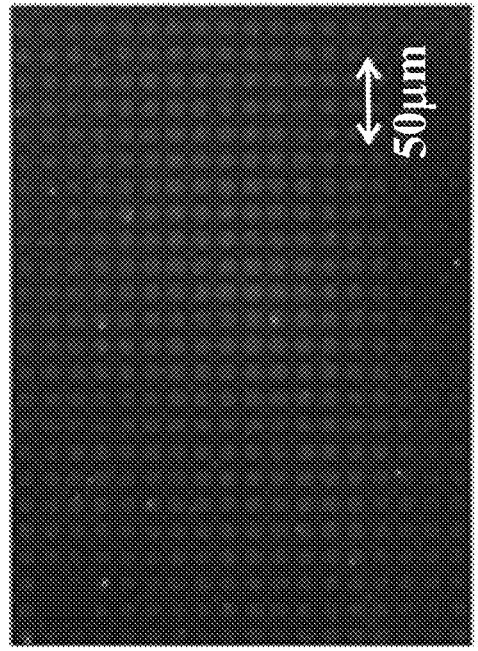
Figure 16E:
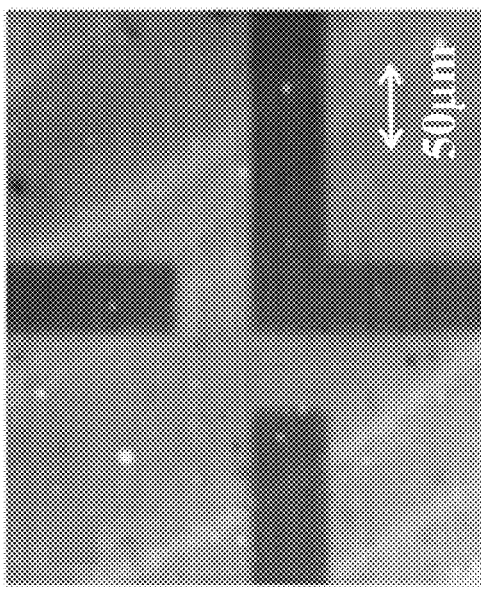
Figure 16F:
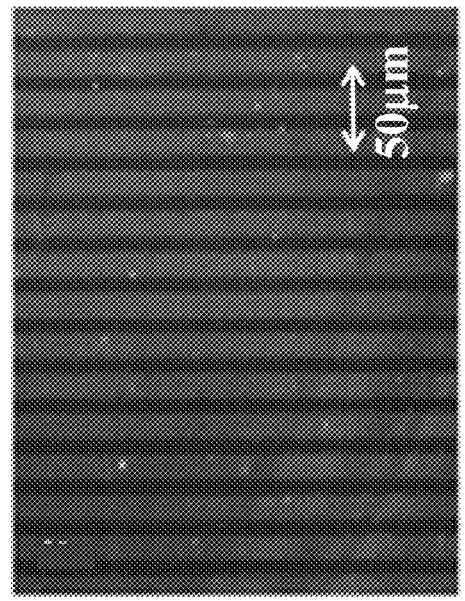

Together, these properties of the ID-1-RF-CP probe can prevent cross-hybridization of the ID-2-GF-CP probe in the un-exposed patterned areas of the substrate, as well as displace any probe that might have hybridized. The second step in the process is photomasking and UV light exposure, which is carried out for five minutes. The third and fourth steps are hybridization of the ID-1-RF-CP probe sequence and the green fluorescent ID-2-GF-CP sequence, respectively. Generally, these hybridization steps take about 30-40 minutes including the wash steps. If necessary, the hybridization step can be carried out under slightly higher stringency (higher Tm) to improve the specificity of the ID-1-RF-CP and ID-2-GF-CP probes to un-exposed and UV exposed areas, respectively. FIGS. 16b-16h show results for a DNA double write process using immobilized FWS: ID1&ID2, the red fluorescent complementary probe ID-1-RF-CP, and the green fluorescent complementary probe ID-2-GF-CP. The letters in the patterned feature (nano) are approximately 40 μm in width, resulting from hybridization of the red fluorescent complementary probe ID-1-RF-CP in the un-exposed areas. FIG. 16b shows a black and white fluorescent image of the hybridized red fluorescent probe ID-1-RF-CP (ex 555 nm, em 571 nm) as white letters on a black background. The image in FIG. 16c shows the hybridized green fluorescent probe ID-2-GF-CP (ex 492 nm, em 517 nm) as a white background with darker letters. FIG. 16d shows the false color image with red fluorescent letters (nano) and a green fluorescent background. Finally, FIGS. 16e-16h show a variety of other UV patterned images using the DNA double write photolithographic process. Some of the spotting and blemishes are due to imperfections and/or inhomogeneity on the substrate surface.

Example 3—DNA Double Write Process and Second Level Write Results

Figure 18A:
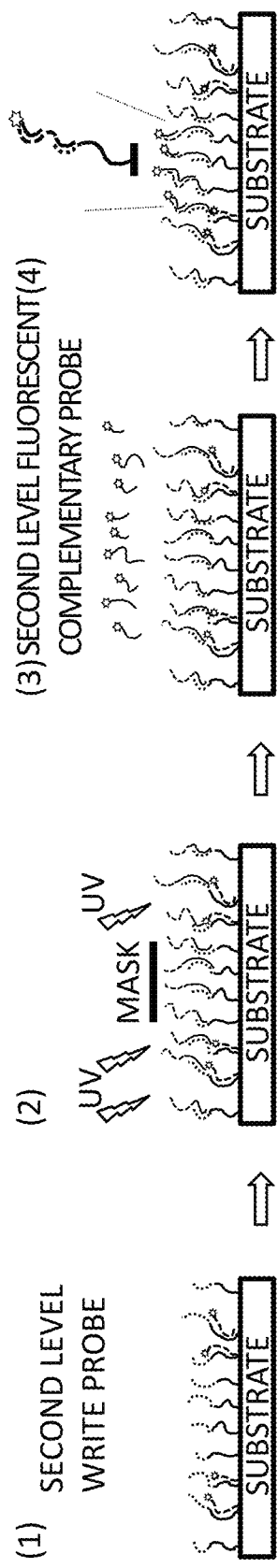
FIGS. 18a-18d show a schematic for a DNA double write with second level write process, and experimental results.
Figure 18D:
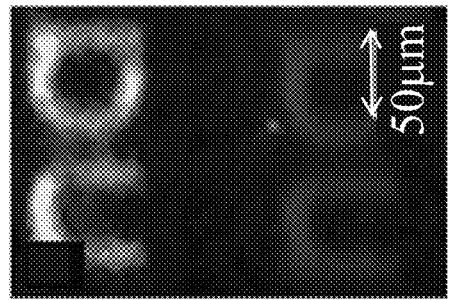
Figure 18C:
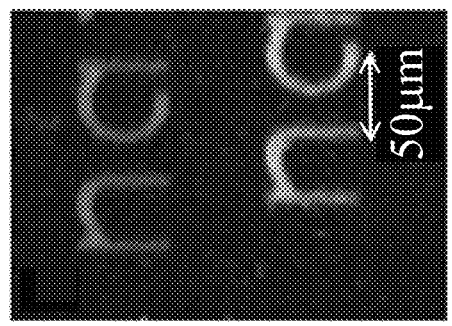
Figure 18B:
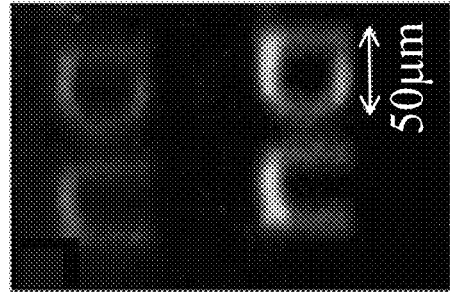

In addition to a first level DNA double write, a second level write also was demonstrated. This is important, as it shows that the process provided herein allows second level UV patterning, as well as further hybridization-based self-assembly, to be carried out. The DNA write sequences and the complementary DNA probe sequences are shown in FIG. 17. The DNA double write process and second level write results are shown in FIG. 18. For a second level write, a write probe sequence is hybridized to either the ID-1 or ID-2 section of the first level write sequence. A second photomasking step is carried out, and then a second level probe sequence is hybridized to the UV exposed and/or the un-exposed second level areas. FIG. 18a shows the process steps for the second level write. A variety of different fluorescent probe combinations can be used to demonstrate the second level write, as indicated in FIGS. 18b, 18c, and 18d. In one case, the second level write sequence was a biotinylated probe (Biotin-5'-AAAAAA AAAAAAAAAAAAAAAAAA-3'; SEQ ID NO:2). After hybridization, the probe was labeled with fluorescent Cy3 streptavidin. This was of further importance, as it demonstrated that in addition to self-assembly by hybridization, it is possible to use biotin-streptavidin ligand binding for further self-assembly.

Example 4—DNA Double Write Process and Line Width Resolution Results

The resolution of the double write process is shown in the images of patterned lines in FIG. 19. In particular, FIGS. 19a, 19b, and 19c show three sets of images for the patterned feature, where line widths for the letters are 10 μm, 5 μm and 2.5 μm respectively. Some of the distortion and blemishes may be due to inhomogeneity of the substrate surface itself. It also is possible that slight movements of the masks during the UV exposure process produced distortions. It is expected that better feature resolution will be achieved when higher performance photomasking and x-y-z positioning systems are used to carry out the double write process. FIGS. 19d and 19e provide further results for patterned line images, showing line widths from 10 μm to 500 nm, with 20 μm spacing gaps (FIG. 19d), and 10 μm patterned lines with spacing gaps from 100 μm to 5 μm (FIG. 19e).

Example 5—Digital Projection Patterning (DPP) for Maskless 3D Patterning

Conventional photolithography requires the use of masks to spatially control light, which typically increases the cost for precision fabrication, and requires a means of alignment when performing multiple mask exposures. Mask-less "reflected" DPP uses a micro-mirror array to spatially control light to a given z focus by reflecting digital images of light through optics to be focused onto a stage. This digital mirror device (DMD) is comprised of a digital light projection (DLP) MEM device (Texas Instruments; Dallas, Tex.) used in conjunction with precision stages, conventional light optics, and one or more light sources capable of a producing several specific wavelengths of light. The DMD functions like a micron UV source HD movie projector/player.

Example 6—Process Schemes for 2D and 3D DNA Nanofabrication and Nanomanufacturing The overall concept and process schemes for 2D and 3D based DNA nanofabrication and nano-manufacturing are shown in FIGS. 20A and 20B. The 2D DNA process (FIG. 20A) involves immobilization of the first DNA write sequence(s) onto a glass or silicon wafer substrate. A patterned mask is placed over the DNA-silicon wafer substrate and exposed to UV light. The substrate is then hybridized with two different complementary DNA sequences. The DNA sequences are designed so one sequence hybridizes specifically to the immobilized write DNA that was exposed to UV, and the other hybridizes specifically to the immobilized write DNA in the areas that were masked. The complementary DNA sequences can be pre-modified or post-modified with a variety of entities (fluorophores, nanoparticles, or proteins). The process can be repeated so that a second layer of write DNA is patterned and hybridized with different complementary DNA sequences. The process can be continued to form further layers with complex patterns.

It is important to note that classical 2D UV photolithography is also 3D in the sense that progressive layers of structures can be created using this process. While classical UV photolithography can be carried out on glass and silicon substrates with large X-Y dimensions (e.g., 14-inch silicon wafers), the layered structures typically are only several hundred nanometers in the Z-dimension. The 3D DNA write process (FIG. 20B) involves starting with a glass or plastic substrate onto which a DPP system generates a porous 3D matrix from polyethylene glycol diacrylate (PEGDA) impregnated with biotin-dextran. The 3D PEGDA matrix material is treated with streptavidin for subsequent immobilization of biotinylated DNA write sequences. A DPP system then is used to produce 3D patterns in the immobilized write DNA for subsequent hybridization of complementary DNA sequences within the 3D PEGDA porous matrix. The process can be repeated to carry out both the formation of additional PEGDA 3D matrixes, as well as further DNA patterning and self-assembly via hybridization. This 3D process thus leads to formation of large 3D X-Y-Z structures that can have macroscopic dimensions, including the Z-dimension.

For conventional 2D UV photolithographic patterning (with masks), it is now possible to use the DNA double write process described herein to produce long distance DNA-based photonic and electronic structures that can transfer photonic and electrical signals across silicon wafers from 150 mm (~6 inches) to 450 mm (~18 inches) or on other large scale substrate materials, opening the door for true DNA based nanophotonic and nanoelectronic applications. For full Z-dimensional 3D materials, the DNA double write process in conjunction with DPP system can allow for fabrication of centimeter size and even larger 3D materials, with long distance DNA photonic and electronic transfer properties among many other new applications.

The results presented herein demonstrate a novel method for UV photolithographic patterning of a unique DNA write substrate and subsequent self-assembly nanofabrication via hybridization. This approach creates two distinguishable identities after UV exposure, which allows two different complementary probes to be hybridized to the UV exposed and un-exposed areas. The key to this new process is in the DNA sequence design, which includes the presence of UV-sensitive thymine bases in the write sequences and the specially designed complementary probe sequences, as well as the inclusion of extended displacer sequences, for greatly improved hybridization specificity to the UV exposed and un-exposed areas. Most importantly, these designs do not preclude encoding large numbers of unique binding identities into the DNA sequences. Thus, the DNA double write processes described herein represent a true synergy of top-down and bottom-up technologies that may allow DNA to truly be the nanofabrication material of the future.

It is appreciated that certain features of the disclosure, which are, for clarity, described in the context of separate embodiments, can also be provided in combination in a single embodiment. Conversely, various features of the disclosure which are, for brevity, described in the context of a single embodiment, can also be provided separately or in any suitable subcombination.

Unless defined otherwise, all technical and scientific terms used herein have the same meaning as is commonly understood by one of ordinary skill in the art to which this disclosure belongs. All patents, applications, published applications, and other publications cited herein are incorporated by reference in their entirety. In the event that there is a plurality of definitions for terms cited herein, those in this section prevail unless otherwise stated.

For the terms "for example" and "such as," and grammatical equivalences thereof, the phrase "and without limitation" is understood to follow unless explicitly stated otherwise. As used herein, the term "about" is meant to account for variations due to experimental error. All measurements reported herein are understood to be modified by the term "about", whether or not the term is explicitly used, unless explicitly stated otherwise. As used herein, the singular forms "a," "an," and "the" include plural referents unless the context clearly dictates otherwise.

OTHER EMBODIMENTS

It is to be understood that while the invention has been described in conjunction with the detailed description thereof, the foregoing description is intended to illustrate and not limit the scope of the invention, which is defined by the scope of the appended claims. Other aspects, advantages, and modifications are within the scope of the following claims.

What is claimed is:

1. A method for producing a solid substrate having DNA immobilized thereon, the method comprising:
   (a) immobilizing onto a solid substrate material a DNA write sequence having a length between 20 and 100 nucleotides, wherein the DNA write sequence comprises a first segment having a length between about 20 and about 50 nucleotides that contains from 10% to 100% thymine bases, wherein the thymine bases are in groups of two or more and are scattered within the first segment, and a second segment that comprises no more than 10% thymine bases;
   (b) covering one or more regions of the substrate and immobilized DNA with a first mask;
   (c) exposing the substrate and immobilized DNA write sequence to ultraviolet or visible radiation to generate an irradiated area of the substrate not covered by the first mask and a non-irradiated area of the substrate covered by the first mask, such that thymine bases in the DNA write sequence within the irradiated area will no longer hydrogen bond to complementary adenine bases; and
   (d) contacting the immobilized DNA write sequence with a first complementary nucleic acid sequence that hybridizes to the immobilized DNA write sequence in the non-irradiated area, and contacting the immobilized DNA write sequence with a second complementary nucleic acid sequence that hybridizes to the immobilized DNA write sequence in the irradiated area, thus generating a first DNA layer,
   wherein the substrate having DNA immobilized thereon is capable of use as a nanoarray or microarray for genotyping.

2. The method of claim 1, wherein the first segment of the DNA write sequence comprises about 10 to about 25 consecutive deoxythymidylate nucleotides.

3. The method of claim 1, wherein the second segment of the DNA write sequence comprises no thymine bases.

4. The method of claim 1, wherein the DNA write sequence is immobilized on the substrate by covalent attachment through a crosslinker.

5. The method of claim 1, wherein the substrate is silicon, glass, or plastic.

6. The method of claim 1, wherein the radiation is ultraviolet radiation.

7. The method of claim 1, wherein the first complementary DNA sequence is specifically designed to hybridize to the first segment of the DNA write sequence that comprises from 10% to 100% thymine bases.

8. The method of claim 1, wherein the second complementary DNA sequence is capable of hybridizing specifically to the second segment of the DNA write sequence that contains no more than 10% thymine bases.

9. The method of claim 1, wherein the first complementary DNA sequence comprises a sequence extension that overlaps with and is identical to a section of the second complementary DNA sequence.

10. The method of claim 1, wherein one or both of the first and second complementary DNA sequences is derivatized with one or more fluorophores, quantum dots, nanoparticles, nanocomponents, peptides, proteins, polymers, biopolymers, binding entities, or crosslinking entities.

11. The method of claim 1, wherein one or both of the first and second complementary DNA sequences comprises an additional DNA sequence beyond the complementary sequence, wherein the additional DNA sequence is not complementary to the immobilized DNA write sequence.

12. The method of claim 1, further comprising:
(e) contacting the first DNA layer with one or more further complementary DNA sequences comprising second and/or third DNA write sequences, each of which contains a first segment comprising 10% to 100% thymine bases and/or a second segment comprising no more than 10% thymine bases;
(f) covering one or more regions of the substrate and immobilized DNA with a second mask;
(g) exposing the substrate and DNA on the substrate to ultraviolet or visible radiation to generate an irradiated area of the substrate not covered by the second mask and a non-irradiated area of the substrate covered by the second mask, such that thymine bases in the DNA write sequence within the irradiated area will no longer hydrogen bond to complementary adenine bases; and
(h) contacting the immobilized DNA with third and fourth complementary DNA sequences that hybridize to the DNA write sequences in the non-irradiated areas of the substrate, and contacting the immobilized DNA with fifth and sixth complementary DNA sequences that hybridize to the DNA write sequences in the irradiated areas of the substrate, thus generating a second DNA layer.

13. The method of claim 12, further comprising:
(i) contacting the second DNA layer with one or more further complementary DNA sequences comprising fourth and/or fifth DNA write sequences, each of which comprises a first segment comprising 10% to 100% thymine bases and/or a second segment comprising no more than 10% thymine bases;
(j) covering one or more regions of the substrate and immobilized DNA with a third mask;
(k) exposing the substrate and immobilized DNA on the substrate to ultraviolet or visible radiation to generate an irradiated area of the substrate not covered by the third mask and a non-irradiated area of the substrate covered by the third mask, such that thymine bases in the DNA write sequence within the irradiated area will no longer hydrogen bond to complementary adenine bases; and
(l) contacting the immobilized DNA with seventh, eighth, ninth and tenth complementary DNA sequences that hybridize to the DNA write sequences in the non-irradiated areas of the substrate, and contacting the immobilized DNA with eleventh, twelfth, thirteenth, and fourteenth complementary DNA sequences that hybridize to the DNA in the irradiated areas of the substrate, thus generating a third DNA layer.

* * * * *